(12) United States Patent
Kiyotomi et al.

(10) Patent No.: US 11,676,844 B2
(45) Date of Patent: Jun. 13, 2023

(54) COATING FILM FORMING APPARATUS AND ADJUSTMENT METHOD THEREFOR

(71) Applicant: Tokyo Electron Limited, Tokyo (JP)

(72) Inventors: Akiko Kiyotomi, Koshi (JP); Masatoshi Kawakita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/430,658

(22) Filed: Jun. 4, 2019

(65) Prior Publication Data

US 2019/0378739 A1 Dec. 12, 2019

(30) Foreign Application Priority Data

Jun. 6, 2018 (JP) .............................. JP2018-108883

(51) Int. Cl.
*H01L 21/68* (2006.01)
*H01L 21/02* (2006.01)
*H01L 21/67* (2006.01)

(52) U.S. Cl.
CPC ...... *H01L 21/681* (2013.01); *H01L 21/02282* (2013.01); *H01L 21/6715* (2013.01); *H01L 21/67051* (2013.01); *H01L 21/67253* (2013.01); *H01L 21/67259* (2013.01)

(58) Field of Classification Search
CPC ....... H01L 21/02282; H01L 21/267253; H01L 21/6715
See application file for complete search history.

(56) References Cited

U.S. PATENT DOCUMENTS

| 4,588,473 A | * | 5/1986 | Hisatomi | .......... | H01L 21/02021 |
| | | | | | 257/E21.237 |
| 6,657,215 B2 | * | 12/2003 | Sakamoto | .......... | G03F 7/70558 |
| | | | | | 250/548 |
| 2003/0003608 A1 | * | 1/2003 | Arikado | ................ | H01L 23/544 |
| | | | | | 438/14 |

(Continued)

FOREIGN PATENT DOCUMENTS

| JP | H07-029809 A | 1/1995 |
| JP | 2002-093697 A | 3/2002 |

(Continued)

*Primary Examiner* — Nathan H Empie
(74) *Attorney, Agent, or Firm* — Pearne & Gordon LLP

(57) ABSTRACT

A coating film forming apparatus includes a carry-in/out section in which a substrate is carried in and carried out; a periphery coating module configured to form a ring-shaped coating film by supplying a coating liquid along a periphery of the substrate based on a processing parameter for controlling a coating state by the coating film; an imaging module configured to image the substrate on which the ring-shaped coating film is formed; a transfer mechanism configured to transfer the substrate; and a controller configured to output a control signal to perform a process of forming the ring-shaped coating film on the substrate based on the processing parameter having different values and imaging the substrate by the imaging module, and configured to determine, based on an imaging result of the substrate, a value of the processing parameter for forming the ring-shaped coating film on the substrate in the periphery coating module.

9 Claims, 25 Drawing Sheets

(56) References Cited

U.S. PATENT DOCUMENTS

| | | | |
|---|---|---|---|
| 2006/0272676 A1* | 12/2006 | Iwase | H01L 22/12 134/33 |
| 2007/0082134 A1* | 4/2007 | Fukuda | G03F 7/168 427/337 |
| 2007/0196566 A1* | 8/2007 | Takeishi | G03F 7/3021 427/145 |
| 2008/0011421 A1* | 1/2008 | Bailey | G01C 25/00 156/345.1 |
| 2008/0013822 A1* | 1/2008 | Pai | G01N 21/9503 382/199 |
| 2009/0122304 A1* | 5/2009 | Jin | G01N 21/9503 356/237.4 |
| 2010/0154826 A1* | 6/2010 | Printz | H01L 21/67028 134/18 |
| 2014/0154890 A1* | 6/2014 | Hatakeyama | H01L 21/6715 438/778 |

FOREIGN PATENT DOCUMENTS

| | | |
|---|---|---|
| JP | 2003-059823 A | 2/2003 |
| JP | 2014-110386 A | 6/2014 |

\* cited by examiner

FIG. 14

DISCHARGE AMOUNT (g)

| DISCHARGE ROTATION NUMBER (rpm) | 0.3 | 0.5 | 0.7 | 0.9 | 1.1 |
|---|---|---|---|---|---|
| 100 | × | ○ | ○ | ○ | |
| 200 | × | × | ○ | ○ | |
| 300 | ////| × | ○ | ○ | |
| 400 | ////| ////| ○ | ○ | |
| 500 | ////| ////| ////| ○ | |

FIG. 15

DISCHARGE AMOUNT (g)

| DISCHARGE ROTATION NUMBER (rpm) | 0.3 | 0.5 | 0.7 | 0.9 | 1.1 |
|---|---|---|---|---|---|
| 100 | ////| ////| ////| ////| ////|
| 200 | ////| △ | ○ | ○ | ○ |
| 300 | ////| ////| △ | △ | ○ |
| 400 | ////| ////| ////| △ | △ |
| 500 | ////| ////| ////| ////| △ |

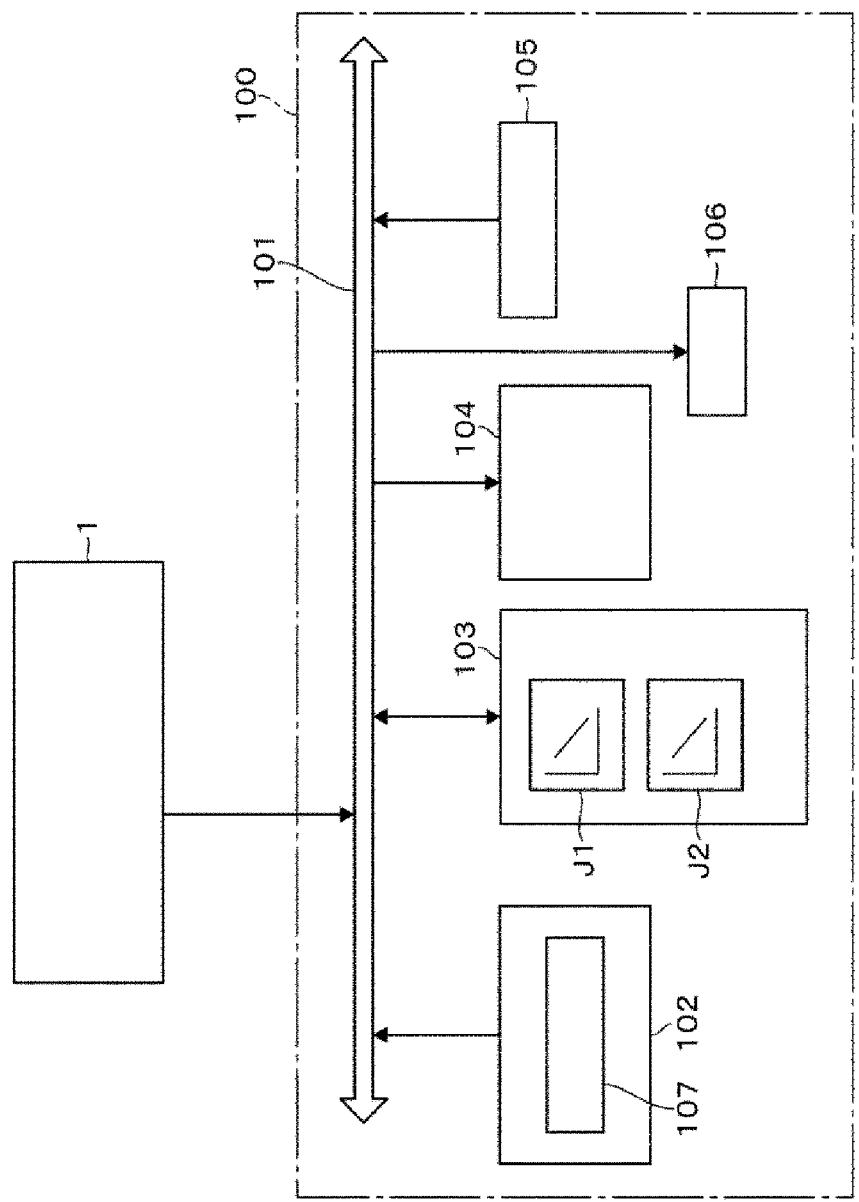

COATING FILM FORMING APPARATUS AND ADJUSTMENT METHOD THEREFOR

CROSS-REFERENCE TO RELATED APPLICATION

This application claims the benefit of Japanese Patent Application No. 2018-108883 filed on Jun. 6, 2018, the entire disclosures of which are incorporated herein by reference.

TECHNICAL FIELD

The various aspects and embodiments described herein pertain generally to a coating film forming apparatus and an adjustment method therefor.

BACKGROUND

In a manufacturing process for a semiconductor device, a circular ring-shaped coating film may be formed by supplying a coating liquid such as a resist along a periphery of a semiconductor wafer (hereinafter, simply referred to as "wafer") as a substrate having a circular shape. Patent Document 1 describes a coating film forming apparatus configured to form a circular ring-shaped coating film. This coating film forming apparatus is equipped with a spin chuck configured to hold a wafer; a rotating mechanism configured to rotate the spin chuck; and a nozzle configured to discharge the resist to a peripheral portion of the wafer without being moved. Further, Patent Document 2 discloses a coating film forming apparatus configured to form a circular ring-shaped coating film. This coating film forming apparatus is further equipped with, in addition to the spin chuck, the rotating mechanism and the nozzle, a moving mechanism configured to move the nozzle horizontally during the discharge of the resist.

Patent Document 1: Japanese Patent Laid-open Publication No. 2003-059823

Patent Document 2: Japanese Patent Laid-open Publication No. 2014-110386

SUMMARY

In view of the foregoing, exemplary embodiments provide a technique capable of reducing a burden on an operator when adjusting an apparatus configured to form a ring-shaped coating film by supplying a coating liquid along a periphery of a circular substrate.

In one exemplary embodiment, a coating film forming apparatus includes a carry-in/out section in which a circular substrate, on which a ring-shaped coating film is to be formed as a coating liquid is supplied thereto, is carried in and out; a periphery coating module configured to form the ring-shaped coating film by supplying the coating liquid along a periphery of the substrate based on a processing parameter for controlling a coating state of the periphery of the substrate by the coating film; an imaging module configured to image the substrate on which the ring-shaped coating film is formed; a transfer mechanism configured to transfer the substrate between the carry-in/out section, the periphery coating module and the imaging module; and a controller configured to output a control signal to perform a first process of forming the ring-shaped coating film on adjustment substrates based on the processing parameter having different values to adjust an operation of the apparatus and imaging the adjustment substrates by the imaging module, and configured to determine, based on an imaging result of each substrate, a value of the processing parameter for forming the ring-shaped coating film on the substrate in the periphery coating module after adjusting the operation of the apparatus.

According to the exemplary embodiment, it is possible to reduce the burden of the operator when adjusting the apparatus configured to form the ring-shaped coating film by supplying the coating liquid along the periphery of the circular substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 14 is a diagram for describing the narrowing of the range of the parameter for the coatability of the resist film;

FIG. 15 is a diagram for describing the narrowing of the range of the parameter regarding the coatability of the resist film;

FIG. 28 is a block diagram of a controller provided in the coating and developing apparatus;

DETAILED DESCRIPTION

Figure 1:
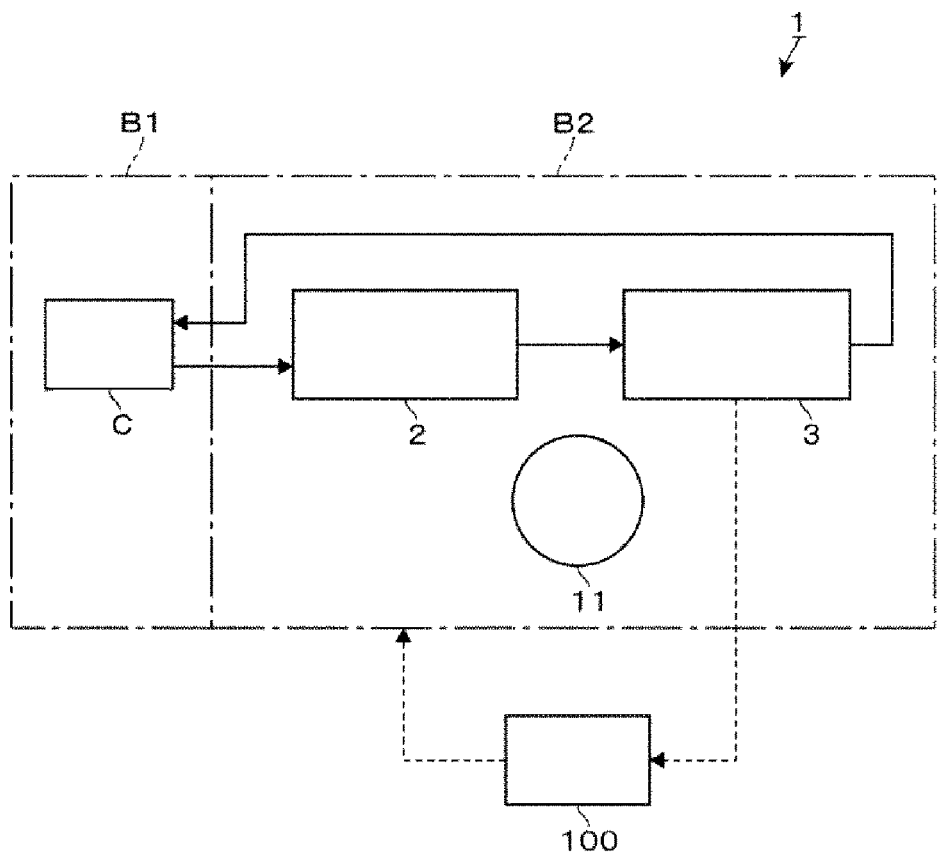
FIG. 1 is a schematic configuration view of a coating and developing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 illustrates a schematic configuration of a coating and developing apparatus 1 as an example of a coating film forming apparatus according to the present disclosure. The coating and developing apparatus 1 is equipped with a carry-in/out block B1 and a processing block B2. The carry-in/out block B1 is configured as a carry-in/out section in which a transfer container C accommodating a multiple number of wafers W therein is carried in and out. The processing block B2 is equipped with a periphery coating module 2 configured to form a resist film by supplying a resist as a coating liquid onto a wafer W; and an imaging module 3 configured to image the wafer W after the resist film is formed thereon. The wafer is transferred between the transfer container C, the periphery coating module 2 and the imaging module 3 by a transfer mechanism 11.

The aforementioned periphery coating module 2 forms the resist film of a circular ring shape by supplying the resist along a periphery of the wafer W which is a circular substrate. For example, this resist film serves as a protection film which suppresses an unnecessary film from being formed on the periphery of the wafer W in a subsequent processing of forming a film on the wafer W. In the coating and developing apparatus 1, before the circular ring-shaped resist film is formed on the wafer W for manufacture of the semiconductor product, an adjustment operation is performed to allow this resist film to be formed appropriately. For the purpose, the wafer W after being processed in the periphery coating module 2 is imaged by the imaging module 3, and a controller 100 composed of a computer automatically performs the adjustment operation based on this imaging result. Here, the wafer W for this adjustment operation may be referred to as an "adjustment wafer W", and the wafer W for the manufacture of the semiconductor product may be referred to as a "product wafer W" to be distinguished from each other.

Figure 2:
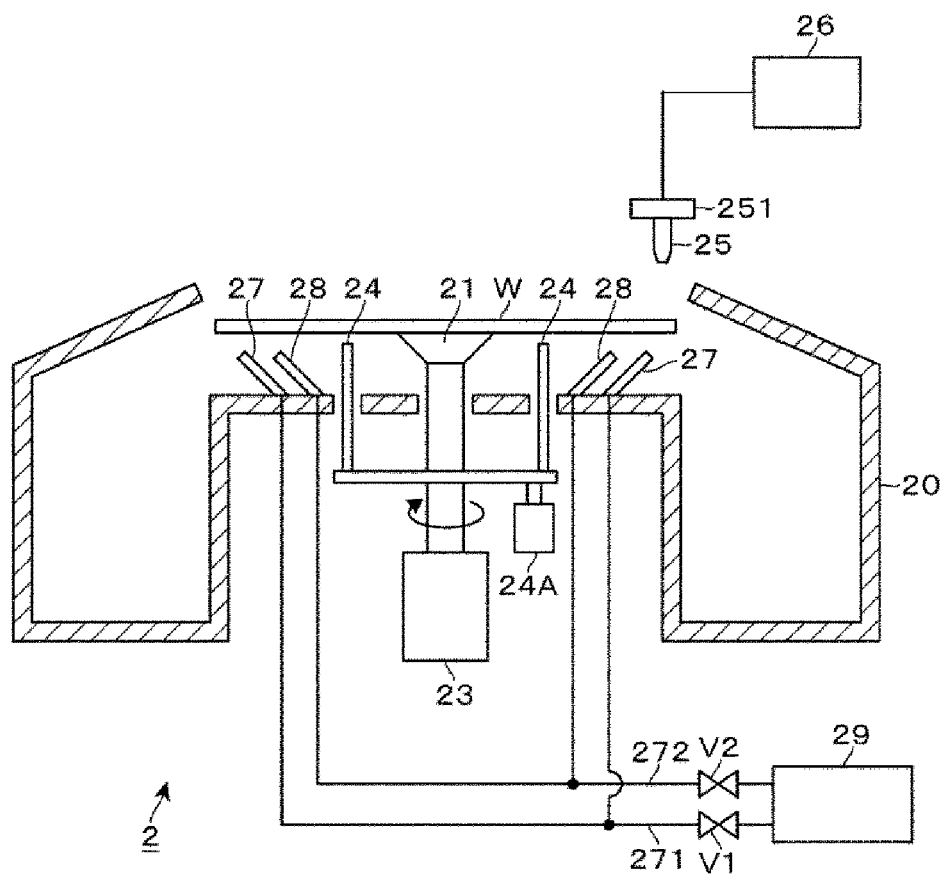
FIG. 2 is a longitudinal side view illustrating a periphery coating module provided in the coating and developing apparatus.

The periphery coating module 2 will be explained with reference to a longitudinal side view of FIG. 2 and a top view of FIG. 3. In the drawings, a reference numeral 21 refers to a spin chuck as a substrate holder configured to attract and hold a center of a rear surface of the wafer W. A reference numeral 23 is a rotating mechanism configured to rotate the wafer W by rotating the spin chuck 21. A recovery cup 20 is disposed around the wafer W held by the spin chuck 21 to suppress various chemical liquids form scattering from the wafer W. The recovery cup 20 is provided with a non-illustrated drain port and a non-illustrated exhaust line through which the inside of the recovery cup 20 is evacuated. In the drawings, a reference numeral 24 represents three vertical elevating pins disposed around the spin chuck 21. These elevating pins 24 are vertically moved up and down by an elevating mechanism 24A to transfer the wafer W between the spin chuck 21 and the transfer mechanism 11 shown in FIG. 3.

The periphery coating module 2 is equipped with a resist supply nozzle 25 as a coating liquid supply nozzle configured to discharge the resist in a vertical direction, for example, and this resist supply nozzle 25 is connected to a resist supply device 26. The resist supply device 26 includes a pump, a valve, and so forth. Provided at a pipe connecting the resist supply nozzle 25 and the resist supply device 26 is a non-illustrated flowmeter which is configured to transmit a signal corresponding to a detection value of a flow rate of the resist flowing in this pipe to the controller 100. The controller 100 may set an offset of an operation of the pump in the resist supply device 26 based on this detection value of the flow rate. That is, as the operation of the pump is controlled by the controller 100, a discharge amount of the resist (resist discharge amount) from the resist supply nozzle 25 is controlled.

Figure 3:
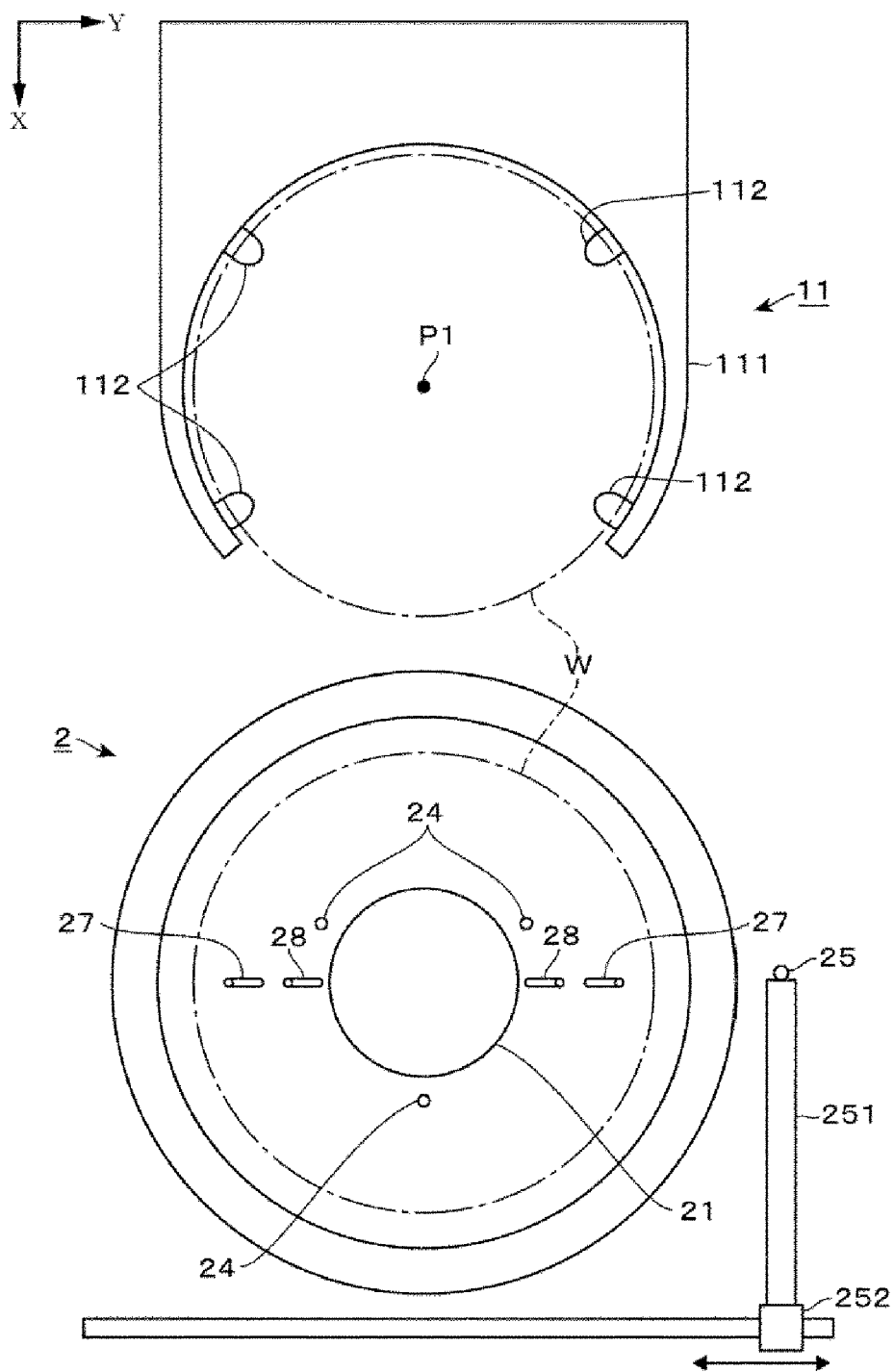
FIG. 3 is a plan view of the periphery coating module.

A reference numeral 251 in FIG. 3 is an arm configured to support the resist supply nozzle 25 at a leading end thereof, and a base end of the arm 251 is connected to a moving mechanism 252. The resist supply nozzle 25 is configured to be movable horizontally and movable up and down by the moving mechanism 252 via the arm 251. By the horizontal movement of the resist supply nozzle 25, a supply position (landing point) of the resist on the wafer W being rotated can be moved from an edge toward a center. That is, the supply position is moved between a position near the center of the wafer W and a position near the edge of the wafer W.

Further, the periphery coating module 2 includes a bevel cleaning nozzle 27 configured to remove a film at a bevel portion of the wafer W and a rear surface cleaning nozzle 28. The bevel cleaning nozzle 27 and the rear surface cleaning nozzle 28 discharge a removing liquid for the resist film and a cleaning liquid for a rear surface of the wafer W, respectively, diagonally upwards from below the wafer W held by the spin chuck 21 and outwards from the center of the wafer W. The landing point of the removing liquid discharged from the bevel cleaning nozzle 27 onto the wafer W is a position ranging from, e.g., 0 mm to 4.5 mm inwards from the edge of the wafer W. A landing point of the cleaning liquid discharged from the rear surface cleaning nozzle 28 onto the wafer W is closer to the center of the wafer W than the landing point of the removing liquid is. For example, the landing point of the cleaning liquid may be a position of, e.g., 70 mm inwards from the edge of the wafer W. Two bevel cleaning nozzles 27 and two rear surface cleaning nozzles 28 may be provided, and these two bevel cleaning nozzles 27 and these two rear surface cleaning nozzles 28 are disposed to face each other with the spin chuck 21 therebetween when viewed from the top.

The removing liquid and the cleaning liquid are solvents of the resist film in this exemplary embodiment. That is, the chemical liquid discharged from the rear surface cleaning nozzle 28 is also the removing liquid for the resist film. The bevel cleaning nozzle 27 is connected to a solvent supply mechanism 29 via a path 271 which is equipped with a valve V1. The rear surface cleaning nozzle 28 is connected to the solvent supply mechanism 29 via a path 272 which is provided with a valve V2. A supply and a stop of the supply of the solvent (removing liquid) from the bevel cleaning nozzle 27 is switched by an opening/closing operation of the valve V1, and a supply and a stop of the supply of the solvent (cleaning liquid) from the rear surface cleaning nozzle 28 is switched by an opening/closing operation of the valve V2.

Now, the transfer mechanism 11 shown in FIG. 3 will be explained. This transfer mechanism 11 is equipped with: a transfer arm 111 configured to surround a part of the circumference of the wafer W; and claw members 112 provided at the transfer arm 111 to support a peripheral portion of the rear surface of the wafer W. The transfer arm 111 is configured to be movable in the X direction and the Y direction shown in FIG. 3. These X and Y directions are horizontal directions orthogonal to each other.

To transfer the wafer W onto the spin chuck 21, the transfer arm 111 holding the wafer W thereon is stopped at a predetermined transfer position above the spin chuck 21. Then, the wafer W is lifted up and supported by the elevating pins 24 which are moved up; the transfer arm 111 is then retreated from above the spin chuck 21; and then the elevating pins 24 are moved down. As these operations are performed in sequence, the wafer W is placed on the spin chuck 21. A point P1 in the drawing is a point within a region surrounded by the transfer arm 111. The aforementioned transfer position for the wafer W is, in other words, an X-coordinate and a Y-coordinate of the point P1 at the moment when the transfer arm 111 is stopped to deliver the wafer W onto the spin chuck 21 as stated above. In an adjustment operation to be described later, adjustment of this transfer position is performed. The adjustment of this transfer position implies adjusting the X-coordinate and the Y-coordinate of the point P1.

Figure 4:
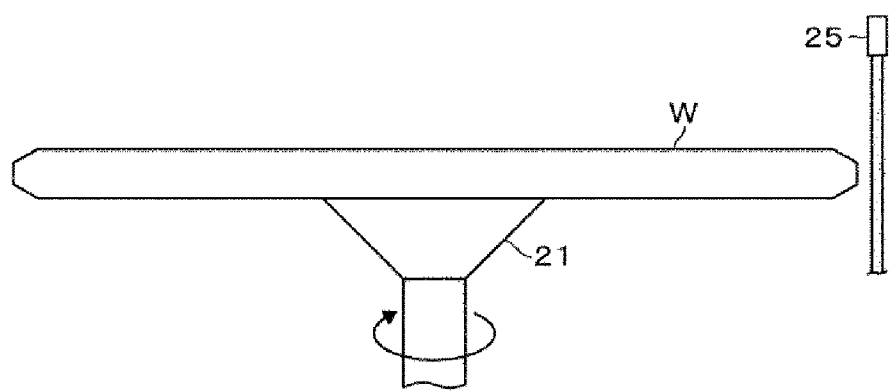
FIG. 4 is a process diagram for describing an operation of the periphery coating module.
Figure 5:
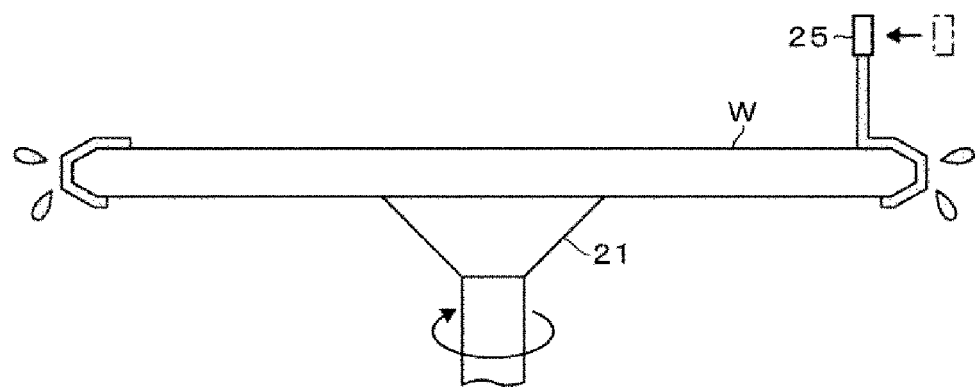
FIG. 5 is a process diagram for describing an operation of the periphery coating module.

Now, a film forming processing performed in the above-described periphery coating module 2 will be explained with reference to FIG. 4 to FIG. 8. First, the wafer W is transferred onto the spin chuck 21 from the transfer mechanism 11 by the above-stated cooperation of the transfer mechanism 11 and the elevating pins 24, and a central portion of the rear surface of the wafer W is held by the spin chuck 21. Thereafter, the wafer W is rotated at a predetermined rotation number (referred to as a "discharge rotation number"), and the resist supply nozzle 25 is moved to a preset position within the recovery cup 20 from a non-illustrated standby region at the outside of the recovery cup 20. If this preset position is set as a "discharge start position", the discharge of the resist is begun at this discharge start position, and the discharged resist passes through the side of the wafer W (FIG. 4). Then, the resist supply nozzle 25 is horizontally moved toward the center of the wafer W, and the resist is supplied to a peripheral portion of the wafer W. If the resist supply nozzle 25 is horizontally moved from the discharge start position by a preset distance (referred to as a "discharge moving distance"), the resist supply nozzle 25 is stopped (FIG. 5). Further, the discharge moving distance corresponds to a width of a resist film R which is previously set by a user.

Figure 6:
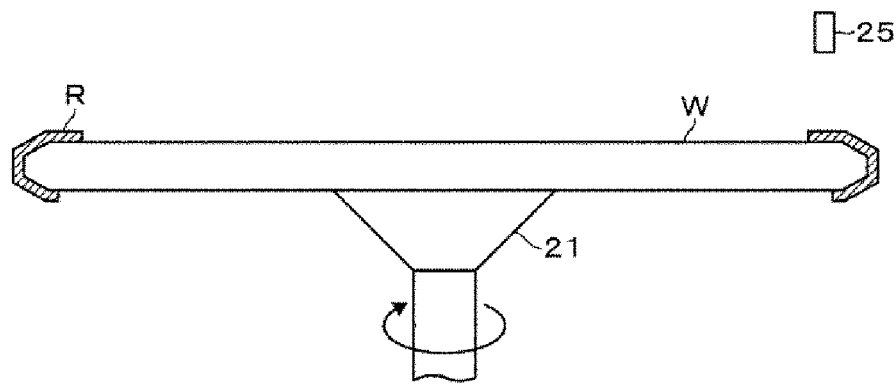
FIG. 6 is a process diagram for describing an operation of the periphery coating module.

If the amount of the resist discharged from the beginning of the discharge reaches a preset amount, the discharge of the resist from the resist supply nozzle 25 is stopped. The resist supplied to the wafer W is flown outwards on the wafer W by a centrifugal force, so that the peripheral portion of the wafer W is coated with the resist. As the rotation of the wafer W is carried on, the resist supplied on the wafer W is dried, and the resist film R having a circular ring shape is formed along the periphery of the wafer W (FIG. 6).

After the formation of the resist film R, a cleaning processing is performed, following the above-described resist coating processing. The rotation number of the wafer W is changed to a predetermined rotation number (referred to as a "cleaning rotation number"), and the removing liquid and the cleaning liquid are respectively discharged from the bevel cleaning nozzle 27 and the rear surface cleaning nozzle 28 at the same time, for example. The removing liquid (solvent) discharged from the bevel cleaning nozzle 27 is flown toward an outer periphery of the wafer W by a centrifugal force to reach a front surface of the wafer W via a bevel portion W0. At a region on which the removing liquid is supplied, the resist film R is dissolved by the removing liquid, and a dissolved material of the resist film is removed by being scattered toward the outside of the wafer W by the centrifugal force (see FIG. 7). That is, an outer periphery of the resist film R is removed.

Figure 8:
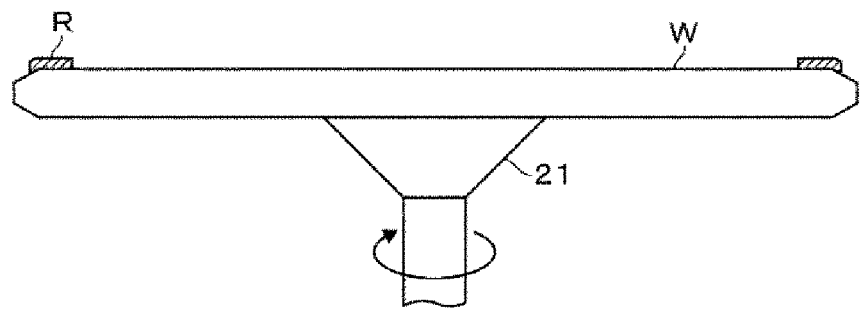
FIG. 8 is a process diagram for describing an operation of the periphery coating module.

A contaminant generated by the coating liquid adhering to the rear surface of the wafer W is removed by the cleaning liquid (solvent) discharged from the rear surface cleaning nozzle 28, and the dissolved resist film is suppressed from reaching and adhering to the rear surface of the wafer W. Thereafter, with a lapse of a predetermined cleaning time after the discharge of the removing liquid and the discharge of the cleaning liquid are begun, the discharge of the removing liquid and the discharge of the cleaning liquid are stopped (FIG. 8). Then, as the rotation of the wafer W is continued, the removing liquid and the cleaning liquid are scattered, so that the wafer W is dried, and the processing in the periphery coating module 2 is completed.

Figure 9:
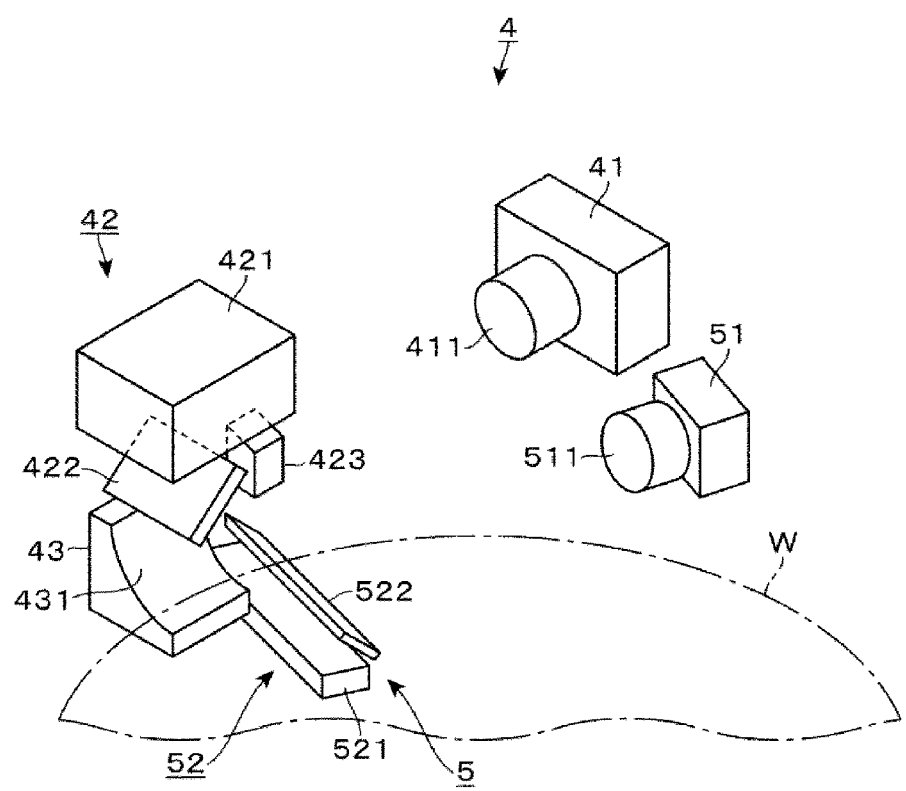
FIG. 9 is a perspective view illustrating a configuration of an imaging module provided in the coating and developing apparatus.
Figure 10:
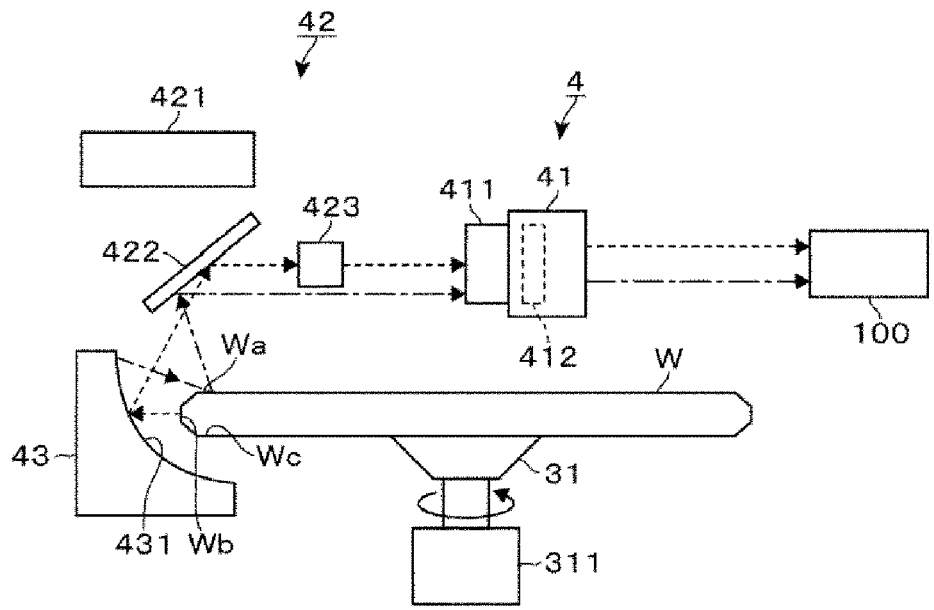
FIG. 10 is a configuration view schematically illustrating an operation of the imaging module.
Figure 11:
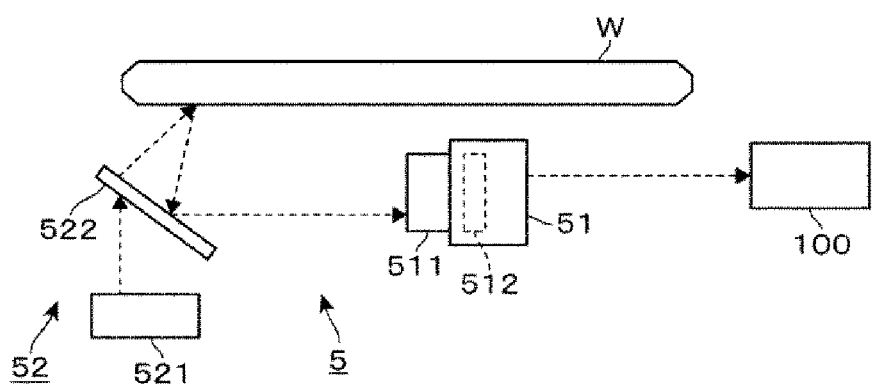
FIG. 11 is a configuration view schematically illustrating an operation of the imaging module.

Now, the imaging module 3 will be explained with reference to FIG. 9 to FIG. 11. FIG. 9 is a schematic perspective view illustrating a configuration of major components of the imaging module 3, and FIG. 10 and FIG. 11 are schematic diagrams illustrating the major components to describe an operation of the imaging module 3. The imaging module 3 is configured to image a peripheral region of the front surface (front surface peripheral region), an outer end surface and the rear surface of the wafer W, and is equipped with a holding table 31 configured to hold the wafer W horizontally and configured to be rotatable around a vertical axis by a rotating mechanism 311 (see FIG. 10). By way of example, the rotating mechanism 311 is equipped with an encoder configured to detect a rotation position of the holding table 31 and is configured to be capable of correlating a rotation position and an imaging position of each surface of the wafer W by a periphery imaging device 4 and a rear surface imaging device 5 to be described later.

The periphery imaging device 4 is configured to image a front surface peripheral region Wa and an outer end surface Wb of the wafer W at the same time. Further, the outer end surface Wb includes the bevel portion W0 which is an inclined surface. The periphery imaging device 4 includes, as depicted in FIG. 9 and FIG. 10, a camera 41, a lighting device 42 and a mirror member 43, and the camera 41 and the lighting device 42 are arranged to be spaced apart from each other in the horizontal direction. The camera 41 is equipped with a lens 411 and an imaging device 412 composed of, for example, a CCD image sensor. The lighting device 42 includes a light source 421 disposed above the wafer W held by the holding table 31, a half mirror 422 and a focus adjustment lens 423. The half mirror 422 is formed to have, for example, a rectangular shape and is inclined at about 45 degrees with respect to the horizontal plane. The focus adjustment lens 423 has a function of varying a combined focal length with the lens 411.

The periphery imaging device 4 is equipped with a mirror member 43. This mirror member 43 is disposed under the half mirror 422 to face the outer end surface Wb and the peripheral region of the rear surface of the wafer W held by the holding table 31. A portion of the mirror member 43 facing the outer end surface Wb of the wafer W or the like is formed as a gently curved surface recessed in a direction away from the outer end surface Wb of the wafer W held by the holding table 31, and this gently curved surface is configured as a reflection surface 431 processed by mirror finishing, for example.

In the lighting device 42, light emitted from the light source 421 is irradiated downwards through the half mirror 422, and diffused light having passed through this half mirror 422 is reflected on the reflection surface 431 of the mirror member 43. Reflection light, which is the diffused light reflected on the reflection surface 431, is mainly irradiated to the outer end surface Wb and the front surface peripheral region Wa of the wafer W. The reflection light reflected from the front surface peripheral region Wa of the wafer W is reflected again by the half mirror 422 to be incident on the imaging device 412 after passing through the lens 411 of the camera 41 without passing through the focus adjustment lens 423, as indicated by a dashed dotted line in FIG. 10. Meanwhile, the reflection light reflected from the outer end surface Wb of the wafer W is reflected by the reflection surface 431 of the mirror member 43 and the half mirror 422 in sequence to be incident on the imaging device 412 after passing through the focus adjustment lens 423 and the lens 411 in sequence, as indicated by a dotted line in FIG. 10.

As stated above, since the light from the front surface peripheral region Wa of the wafer W and the light from the outer end surface Wb of the wafer W both arrive at the imaging device 412 of the camera 41, the camera 41 is capable of imaging both the front surface peripheral region Wa of the wafer W and the outer end surface Wb of the wafer W. Image data obtained by the camera 41 are sent to the controller 100.

The rear surface imaging device 5 is equipped with, as depicted in FIG. 9 and FIG. 11, a camera 51 and a lighting device 52. The camera 51 is configured as an imaging mechanism including a lens 511 and an imaging device 512 composed of, for example, a CCD image sensor. The camera 51 and the lighting device 52 are arranged to face each other. The lighting device 52 is disposed under the wafer W held by the holding table 31 and equipped with a light source 521 and a half mirror 522. The half mirror 522 is formed to have, for example, a rectangular shape and is inclined at about 45 degrees with respect to the horizontal plane. Light emitted from the light source 521 located under the half mirror 522 passes through the half mirror 522 to be irradiated upwards. The light having passed through the half mirror 522 in this way is reflected on the rear surface of the wafer W and then reflected again by the half mirror 522 to pass through the lens 511 of the camera 51 and to be incident at the imaging device 512. Image data of the rear surface of the wafer W obtained in this way are transmitted to the controller 100.

In this imaging module 3, the holding table 31 on which the wafer W is placed is rotated one round by the rotating mechanism 311 based on a control signal outputted from the controller 100. During this rotation, the light sources 421 and 521 are turned on and imaging by the cameras 41 and 51 are performed in the periphery imaging device 4 and the rear surface imaging device 5, respectively. Accordingly, the front surface peripheral region Wa of the wafer W, the outer end surface Wb of the wafer W and the rear surface Wc of the wafer W are imaged along the entire circumference of the wafer W, and obtained image data are sent to the controller 100.

Figure 7:
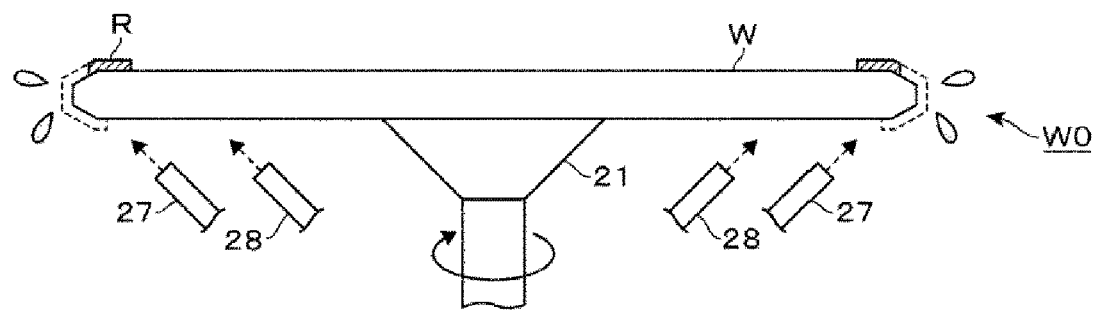
FIG. 7 is a process diagram for describing an operation of the periphery coating module.
Figure 12:
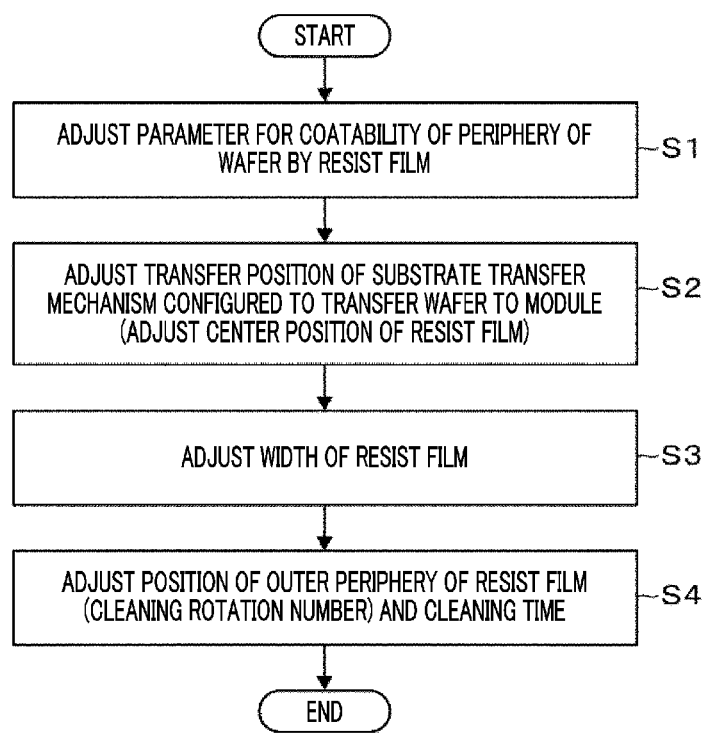
FIG. 12 is a flowchart illustrating parameter adjustments performed in the coating and developing apparatus.

Now, an adjustment operation performed in the coating and developing apparatus 1 will be discussed. FIG. 12 is a flowchart showing this adjustment operation, and this adjustment operation is automatically performed by the controller 100 after an instruction from the user of the coating and developing apparatus 1 to start the operation. Below, an outline of this flow will be explained. In each process of the flow, an adjustment wafer W is transferred into the periphery coating module 2 from the transfer container C, and the film forming processing composed of the coating processing described in FIG. 4 to FIG. 6 and the cleaning processing described in FIG. 7 and FIG. 8 are performed on this adjustment wafer W. Then, the adjustment wafer W having the resist film formed thereon is imaged in the imaging module 3, and suitability is determined based on the acquired image data. The adjustment wafer W after being imaged is returned back into the transfer container C.

In the flow of FIG. 12, a process S1 is performed as a first process to decide process parameters for allowing the periphery of the wafer W to be coated with the resist film R along the entire circumference of the wafer W. These process parameters are ones for controlling a coating state of the periphery of the wafer W with the resist film R. To elaborate, the process parameters are the discharge rotation number and the resist discharge amount used in the coating processing described in FIG. 4 to FIG. 6. In this process S1, a combination of parameters for allowing the periphery of the wafer W to be appropriately coated with the resist is determined from multiple candidate values of the resist discharge rotation number and multiple candidate values of the resist discharge amount. To be specific, the film forming processing is performed on a plurality of wafers W while varying the combination of the discharge rotation number and the resist discharge amount, and an appropriate combination is selected based on imaging results of the respective wafers W after the film forming processing. Then, in processes after this process S1, the coating processing is performed by using the combination of the discharge rotation number and the resist discharge amount which is determined in the process S1.

After the process S1, there is performed a process S2 of adjusting the transfer position of the wafer W which is the position data of the transfer mechanism 11 at the time when the transfer mechanism 11 delivers the wafer W to the periphery coating module 2 as described in FIG. 3 along with the periphery coating module 2 and the transfer mechanism 11. In processes after this process S2 as a second process, the transfer of the wafer W is performed at the adjusted transfer position. Subsequently, there is performed a process S3 as a third process of adjusting the discharge moving distance of the resist supply nozzle 25 as described in FIG. 5, that is, adjusting the width of the resist film R. Processes after this process S3 are performed with the adjusted discharge moving distance. Then, a process S4 as a fourth process of adjusting the cleaning rotation number and the cleaning time described in FIG. 7 is performed. As will be described later, the adjusting of the cleaning rotation number means adjusting a position of an outer edge of the resist film R. Then, after the completion of the flow of FIG. 12, a product wafer W is transferred from the transfer container C into the periphery coating module 2 and processed therein in the same way as the adjustment wafer W is processed. The transfer, and then, the processing of this product wafer W are performed by using the parameters determined in the processes S1 to S4.

Before the flow is begun, initial values of the transfer position, the cleaning rotation number and the cleaning time are set based on, for example, adjustment results of a module configured to perform the same processing as in the periphery coating module 2 which performs the adjustments. Before the adjustment in each process is carried out, the processing is performed based on these initial values. Further, the width of the resist film R is set to a value desired by the user before the flow is begun, and the initial value of the discharge moving distance is set based on the set width. For the parameters decided in the process S1, the candidate values are previously set, as will be described later. That is, even before the adjustments of the respective parameters are performed in the processes S1 to S4, the film forming processing described in FIG. 4 to FIG. 8 can still be performed.

Now, each process will be discussed in detail. First, the process S1 and an operation performed by the user before the process S1 will be described with reference to FIG. 13. As stated above, the process S1 is the process of deciding the discharge rotation number and the resist discharge amount, and these parameters are decided from candidate ranges which are previously set. To elaborate, in the present exemplary embodiment, a candidate range from 100 rpm to 500 rpm for the discharge rotation number and a candidate range from 0.3 g to 1.1 g for the resist discharge amount are stored in the controller 100.

In the process S1, the film forming processing is performed on the adjustment wafer W by setting each parameter to the corresponding candidate value in the candidate range. By way of example, the candidate values of the discharge rotation number may be values at a preset pitch within the candidate range, e.g., at a pitch of 100 rpm. That is, in this exemplary embodiment, the candidate values of the discharge rotation number are 100 rpm, 200 rpm, 300 rpm, 400 rpm and 500 rpm. By way of example, candidate values of the resist discharge amount may be values at a preset pitch within the candidate range, e.g., at a pitch of 0.2 g. That is, in this exemplary embodiment, the candidate values of the resist discharge amount are 0.3 g, 0.5 g, 0.7 g, 0.9 g and 1.1 g.

Accordingly, combinations of the candidate values of the discharge rotation number and the candidate values of the resist discharge amount are previously set to perform the film forming processing on the adjustment wafer W. For these combinations, however, narrowing of the range of these combinations (range narrowing) is performed before the beginning of the process S1, and only the combinations within the narrowed range are used in the film forming processing of the process S1. This range narrowing is automatically performed by inputting a viscosity of the resist to be used and a target discharge amount which is a range of the resist discharge amount used in a single time of the film forming processing.

Figure 13:
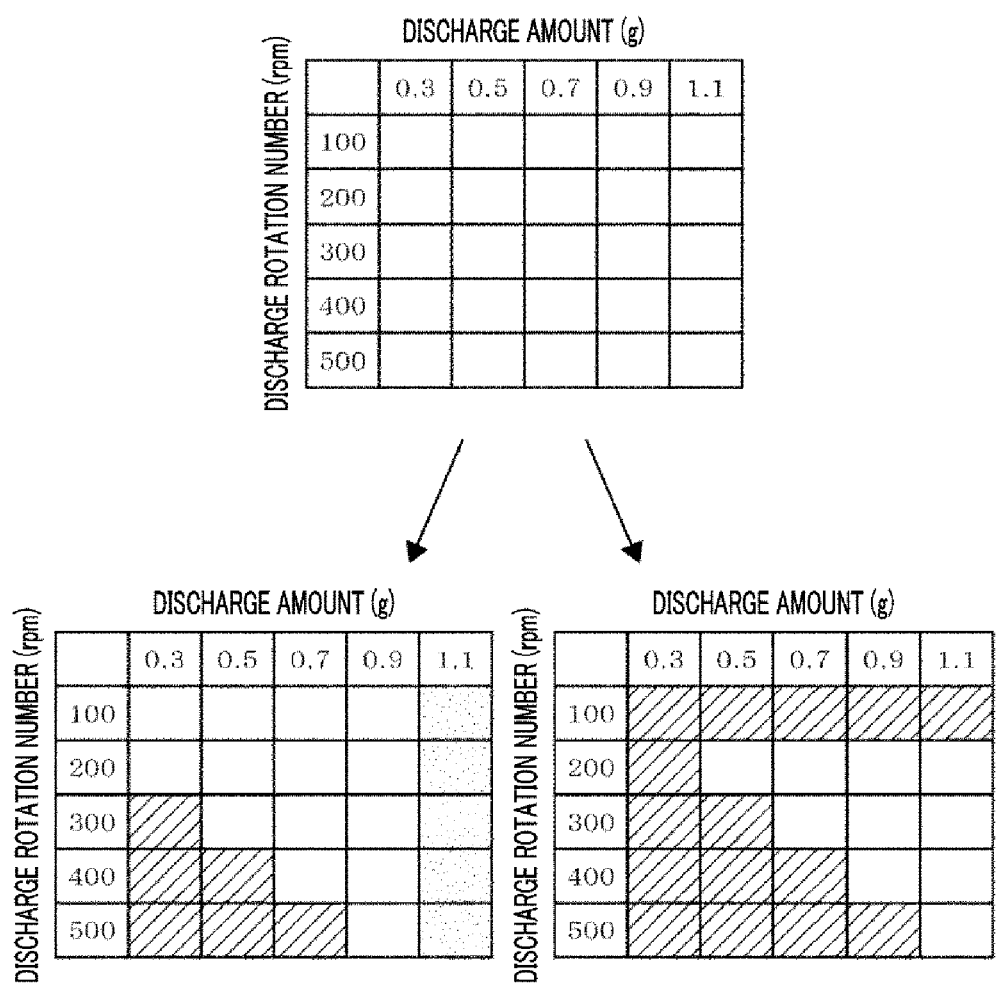
FIG. 13 is a diagram for describing narrowing of a range of a parameter for coatability of a resist film.

FIG. 13 shows the range narrowing. In tables of this drawing, the aforementioned candidate values of the resist discharge amount are increasingly arranged in the horizontal direction and the candidate values of the discharge rotation number are increasingly arranged in the vertical direction. In the tables, each mass represents a combination of the resist discharge amount and the discharge rotation number. It is assumed that masses indicating combinations set to be used in this process S1 are not marked. The upper table of FIG. 13 shows a state before the range narrowing through the input of the viscosity of the resist and the target discharge amount is accomplished, and the lower two tables of FIG. 13 show states after the range narrowing is carried out.

The lower left-hand table of FIG. 13 shows the range narrowing in which a relatively low viscosity equal to or less than a preset reference value is inputted as the viscosity of the resist and a target discharge amount less than 1 g is inputted. The lower right-hand table of FIG. 13 shows the range narrowing in which a relatively high viscosity higher than the preset reference value is inputted as the viscosity of the resist and a target discharge amount equal to or less than a value larger than 1.1 g is inputted. In each of these lower-side tables, masses excluded, through the input of the target discharge amount, from the combinations of the candidate values to be used in the process S1 are indicated by being dotted and masses excluded, through the input of the viscosity, from the combinations of the candidate values to be used in the process S1 are indicated by being hatched. In case that the target discharge amount of the aforementioned value is inputted, combinations of the candidate values having the resist discharge amount of 1.1 g are excluded in the left-hand table. In the right-hand table, since each candidate value of the resist discharge amount is equal to or less than the upper limit of the inputted target discharge amount, the exclusion of the combinations is not performed with this target discharge amount.

If the resist discharge amount is relatively large, influence of the discharge rotation number upon coatability of the periphery of the wafer W by the resist is small. With a decrease of the resist discharge amount, however, the range of the discharge rotation number for obtaining appropriate coatability is narrowed. In case that the viscosity of the resist is relatively low, fluidity of the resist supplied to the wafer W is high, so the resist has high coatability on the wafer W. If, however, the discharge rotation number is too high, the amount of the resist scattered from the wafer W by the centrifugal force is increased. Thus, if the resist discharge amount is too little, the periphery of the wafer W may not be sufficiently coated with the resist. For the reason, if the viscosity is relatively low, only the combinations of a relatively high discharge rotation number and a relatively small resist discharge amount are excluded from the combinations of the candidate values to be used in the process S1. To elaborate, in the example of FIG. 13, combinations of the resist discharge amount of 0.3 g and the discharge rotation number of 300 rpm, 400 rpm and 500 rpm, combinations of the resist discharge amount of 0.5 g and the discharge rotation number of 400 rpm and 500 rpm and combinations of the resist discharge amount of 0.7 g and the discharge rotation number of 500 rpm are only excluded.

In case that the viscosity is relatively high, the fluidity of the resist supplied to the wafer W is low, so the coatability of the wafer W by the resist is low. Thus, if one of the discharge rotation number and the resist discharge amount is too small, it is deemed that the appropriate resist film R cannot be formed. Therefore, in the example shown in FIG. 13, combinations of the candidate values with the discharge rotation number of 100 rpm and combinations of the candidate values with the resist discharge amount of 0.3 g are excluded from the combinations of the candidate values to be used. Further, if film formation is performed by supplying the resist having a relatively high viscosity and the resist having a relatively low viscosity at the same amount to the wafer W, respectively, the resist having the relatively high viscosity has a narrower range of the discharge rotation number enabling the film formation, as compared to the resist having the relatively low viscosity, due to the fluidity of the resist. To be more specific, as the resist has the relatively higher viscosity, the minimum discharge rotation number enabling the film formation is higher. Accordingly, in this example, combinations of the resist discharge amount of 0.5 g and the discharge rotation number of 300 rpm, 400 rpm and 500 rpm, combinations of the resist discharge amount of 0.7 g and the discharge rotation number of 400 rpm and 500 rpm and combinations of the resist discharge amount of 0.9 g and the discharge rotation number of 500 rpm are excluded.

After the range of the combinations of the parameters to be used is narrowed as stated above, the process S1 is begun. As described above, the wafers W are transferred into the periphery coating module 2 from the transfer container C in sequence, and the film forming processing is performed on the adjustment wafer W as described in FIG. 4 to FIG. 8 by using the individual combinations of the candidate values of the discharge rotation number and the resist discharge amount within the narrowed range. Each wafer W after being subjected to the film forming processing is transferred into the imaging module 3, and the imaging of the wafer W is carried out by the cameras 41 and 51, and the image data of each wafer W are obtained by the controller 100. Then, normality or abnormality of the processing is determined based on, in the obtained image data, image data from the camera 41 including the front surface peripheral region Wa of the wafer W.

Figure 16A:
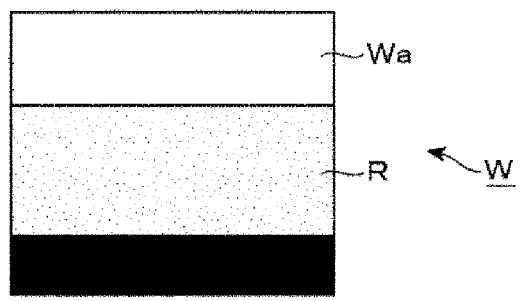
FIG. 16A is a schematic diagram illustrating the resist film imaged by the imaging module.
Figure 16B:
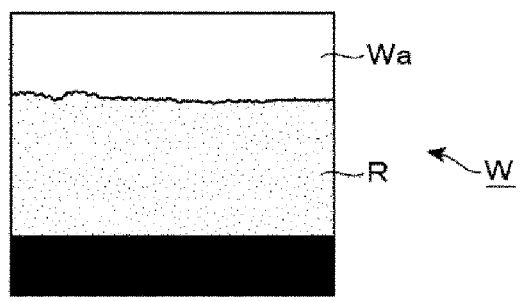
FIG. 16B is a schematic diagram illustrating the resist film imaged by the imaging module.
Figure 16C:
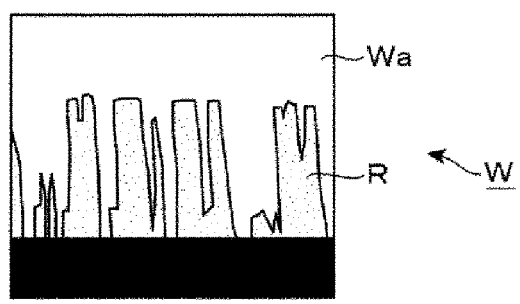
FIG. 16C is a schematic diagram illustrating the resist film imaged by the imaging module.

A table of FIG. 14 shows an example of the determination result obtained by performing a processing after the range narrowing in the case of coating the resist having the relatively low viscosity as illustrated in the lower left-hand table of FIG. 13 is performed. A table of FIG. 15 shows an example of a determination result obtained by performing a processing after the range narrowing in the case of coating the resist having the relatively high viscosity as illustrated in the lower right-hand table of FIG. 13 is performed. The tables of FIG. 14 and FIG. 15 present, like the tables of FIG. 13, combinations of the discharge rotation number and the resist discharge amount, and the determination results are indicated by O, Δ, X which are assigned to respective masses of the tables. Here, "O" implies that the processing is normal; "Δ" implies that the processing is abnormal but the abnormality degree is low; "X" implies that the processing is abnormal with high abnormality degree. Examples of images which are determined to be O, Δ, and X are illustrated in FIG. 16A, FIG. 16B and FIG. 16C, respectively. In FIG. 16A to FIG. 16C, the resist film R is marked by dots, and an outside of the wafer W is colored black. Further, although the imaging is performed along the entire circumference of the wafer W by the imaging module 3 as stated above, each of FIG. 16A to FIG. 16C illustrates an image of only a part of the circumference of the wafer W cut from the acquired image for the simplicity of the illustration.

If the entire periphery of the wafer W is coated with the resist film R and a variation of a position of an inner periphery edge of the resist film R is suppressed when viewed along the entire circumference of the resist film R, that is, if the inner periphery edge of the resist film R does not have a zigzag shape, the image (processing) is deemed to be normal. If, on the other hand, the zigzag shape is observed or there is a place, on the periphery of the wafer W, where the resist film R is not formed, the image (processing) is deemed to be abnormal. Further, the controller 100 is configured to be capable of distinguishing, based on, for example, colors on the image, a portion of the wafer W which is coated with the resist film R and a portion of the wafer W which is not coated.

After the normality or abnormality is determined, an appropriate combination is selected from combinations which are found to be normal ("O"). In this determination, a previously set recommended range of the discharge rotation number is used, for example. In combinations considered to be normal in combinations including discharge rotation numbers within this recommended range of the discharge rotation number, a combination having a resist discharge amount closest to a resist discharge amount of a combination determined to be abnormal is excluded from candidates of the appropriate combination. Then, in the remaining combinations which are not excluded, a combination having a smaller resist discharge amount is determined as the appropriate combination, for example.

A sequence of determining the appropriate combination will be described in detail for an example case where the recommended range of the discharge rotation number is 200 rpm to 300 rpm and the determination upon the normality or the abnormality is made as presented in the table of FIG. 14. In the table of FIG. 14, when the discharge rotation number is 200 rpm, the determination result is "X" when the resist discharge amount is 0.3 g and 0.5 g, whereas the determination result is "O" when the resist discharge amount is 0.7 g and 0.9 g. That is, when the resist discharge amount is 0.7 g, the determination result is "O". However, when the resist discharge amount is 0.5 g which is the closest to 0.7 g, the determination result is "X". Accordingly, the combination of the discharge rotation number of 200 rpm and the resist discharge amount of 0.7 g is excluded from the candidates of the appropriate combination. Further, when the discharge rotation number is 300 rpm, the determination result is "X" when the resist discharge amount is 0.5 g, whereas the determination result is "O" when the resist discharge amount is 0.7 g and 0.9 g. That is, when the resist discharge amount is 0.7 g, the determination result is "O". However, a combination of the resist discharge amount of 0.5 g, which is the closest to 0.7 g, and the discharge rotation number of 300 rpm is found to be "X". Accordingly, the combination of the discharge rotation number of 300 rpm and the resist discharge amount of 0.7 g is excluded from the candidate of the appropriate combination. As a result of these exclusions, the combination of the discharge rotation number of 200 rpm and the resist discharge amount of 0.9 g and a combination of the discharge rotation number of 300 rpm and the resist discharge amount of 0.9 g are left as the candidates of the appropriate combination. Although the one having the smaller resist discharge amount is selected as the appropriate combination as stated above, these two combination are both determined to be appropriate as their resist discharge amounts are same (0.9 g).

A sequence of determining the appropriate combination when the determinations are made as presented in the table of FIG. 15 will also be explained. When the discharge rotation number is 200 rpm, the determination result is "Δ" when the resist discharge amount is 0.5 g, whereas the determination result is "O" when the resist discharge amount is 0.7 g, 0.9 g and 1.1 g. Although the combination of the resist discharge amount of 0.7 g and the discharge rotation number of 200 rpm is found to be "O", this combination is excluded from the candidates of the appropriate combination as the combination of the resist discharge amount of 0.5 g, which is the closest to 0.7 g, and the discharge rotation number of 200 rpm is considered to be "Δ". Further, when the discharge rotation number is 300 rpm, the determination result is "Δ" when the resist discharge amount is 0.7 g and 0.9 g, and the determination result is "O" when the resist discharge amount is 1.1 g. That is, although the determination result is "O" when the resist discharge amount is 1.1 g, the combination of the resist discharge amount of 0.9 g, which is the closest to 1.1 g, and the discharge rotation number of 300 rpm is found to be "Δ". Accordingly, the combination of the discharge rotation number of 300 rpm and the resist discharge amount of 1.1 g is excluded from the candidates of the appropriate combination. As a result of this exclusion, the combination of the discharge rotation number of 200 rpm and the resist discharge amount of 0.9 g and the combination of the discharge rotation number of 200 rpm and the resist discharge amount of 1.1 g are left as the candidates of the appropriate combination. In these two combinations, the combination with the smaller resist discharge amount, that is, the combination of the discharge rotation number of 200 rpm and the resist discharge amount of 0.9 g is selected as the appropriate combination. In the tables of FIG. 14 and FIG. 15, masses indicating the appropriate combinations decided as described above are marked by being surrounded by dotted lines.

If the appropriate combination cannot be determined within the recommended range of the discharge rotation number, the appropriate combination is decided from outside the recommended range of the discharge rotation number according to the above-described rule. That is, in the combinations with the discharge rotation number of 100 rpm, 400 rpm and 500 rpm, the appropriate combination is selected according to the same rule as used in determining the appropriate combination from the combinations with the discharge rotation number of 200 rpm and 300 rpm. If the appropriate combination cannot still be selected from outside the recommended range of the discharge rotation number, the flow of the automatic adjustment is stopped and an alarm is outputted, for example.

Figure 17:
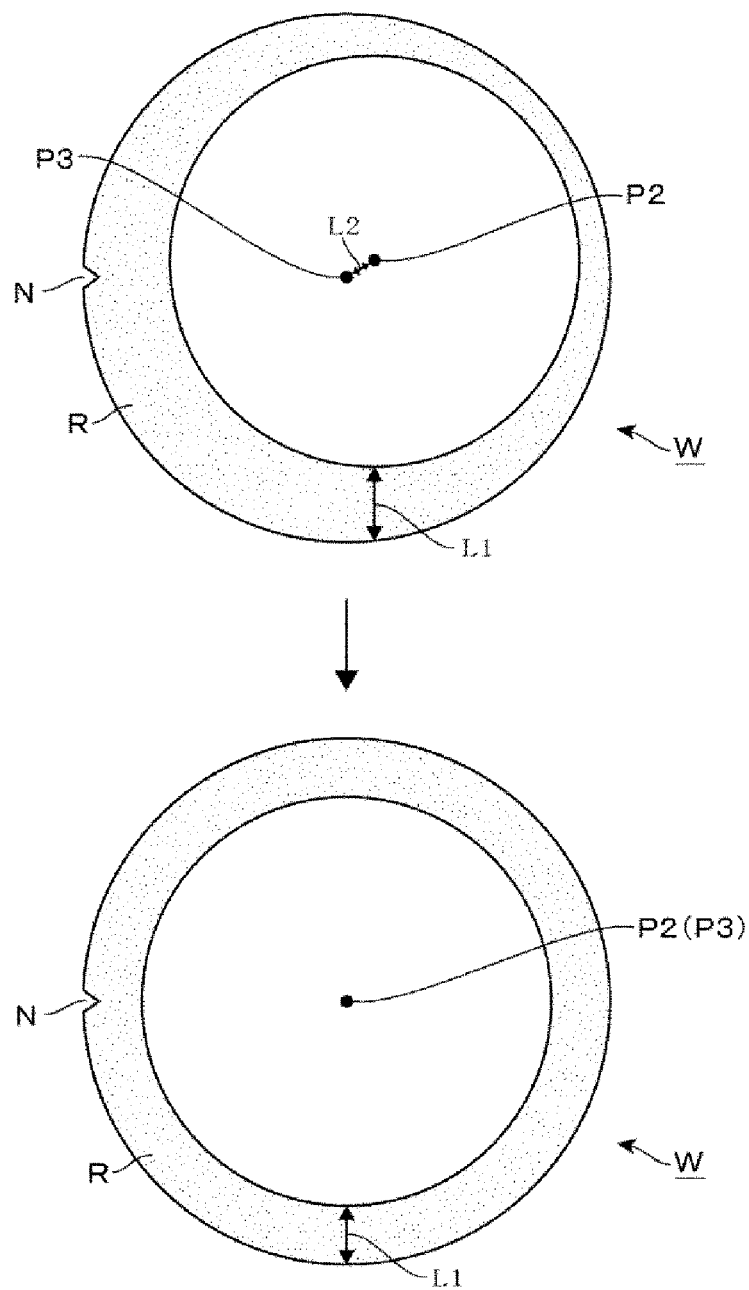
FIG. 17 is a diagram for describing a change of a transfer position with respect to the periphery coating module.
Figure 18:
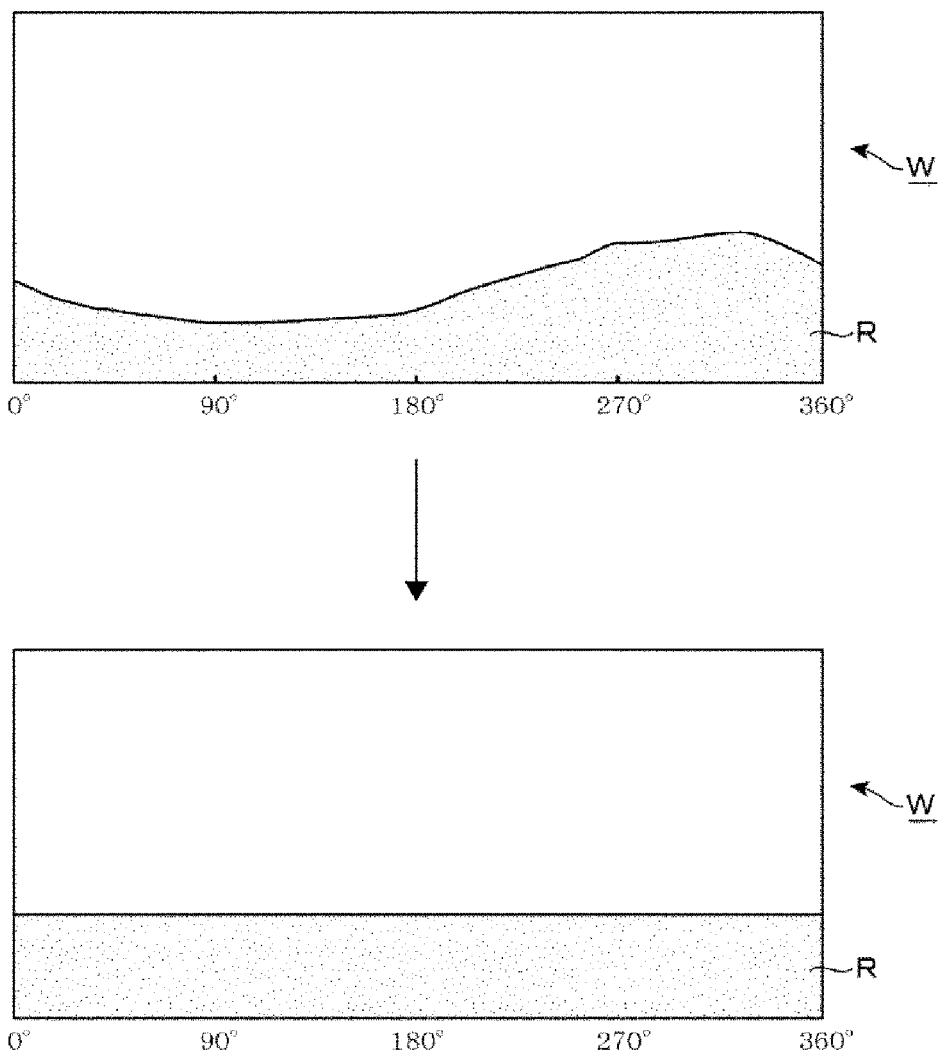
FIG. 18 is a diagram for describing a change of an image which is made as the transfer position is changed.

Now, the process S2 of adjusting the transfer position of the wafer W will be explained with reference to FIG. 17 and FIG. 18 which provide an outline of the adjustment. An upper drawing and a lower drawing of FIG. 17 illustrate the front surfaces of the adjustment wafers W on which the resist film R is formed before and after the transfer position is adjusted, respectively. An upper drawing and a lower drawing of FIG. 18 are schematic images of the adjustment wafers W obtained by the camera 41 of the imaging module 3 before and after the transfer position is adjusted, respectively. Individual positions on rectangular images of FIG. 18 in the horizontal direction correspond to individual positions on the circumference of the wafer W and are indicated by angular degrees of 0° to 360°. Further, individual positions on the images of FIG. 18 in the vertical direction correspond to individual positions ranging from the circumference edge of the wafer W to the center thereof. An upper side of each image shows a center side of the wafer W. Thus, between an upper end of the resist film R and a lower end of the resist film R on the images, the upper end indicates the inner periphery edge of the resist film R. Further, as illustrated in FIG. 16A to FIG. 16C, though each of the obtained images includes the region outside the wafer W, the illustration of this outside region is omitted in FIG. 18. As shown in FIG. 17 and FIG. 18, by adjusting the transfer position in the process S2, a width L1 of the resist film R is uniformed along the entire circumference of the wafer W.

Now, a sequence of specific operations of the process S2 will be described. As stated above, in the process S2 as well, the formation of the resist film R on the adjustment wafer W in the periphery coating module 2 and the imaging of the adjustment wafer W in the imaging module 3 are performed. From the image obtained from the imaging module 3, the width L1 is detected at multiple positions, for example, 360 positions equi-spaced along the circumference of the wafer W. An eccentric amount L2 between a center P2 of the inner periphery edge of the resist film R and a center P3 of the wafer W is calculated from the widths L1, and it is determined whether this eccentric amount L2 is smaller than, for example, a target eccentric amount which is previously set before the beginning of the flow.

If the eccentric amount L2 is found to be smaller than the target eccentric amount, the process S2 is ended. If the eccentric amount L2 is found to be equal to or larger than the target eccentric amount, an X-direction position and a Y-direction position of the transfer position are respectively corrected to correspond to this eccentric amount. To elaborate, as depicted in FIG. 17, an X-coordinate and a Y-coordinate of the point P1 shown in FIG. 3 when the wafer W is transferred onto the spin chuck 21 are adjusted such that the center P2 of the resist film R and the center P3 of the wafer W are coincident with each other. Further, for example, by accommodating the wafer W in the transfer container C in a predetermined direction, a notch of the wafer W at the transfer position is set to be oriented toward a preset direction so that the controller 100 can detect these adjustment amounts in the X-direction and the Y-direction. Since the controller 100 can detect the notch N from the image, the controller 100 can find out the adjustment amounts of the X-coordinate and Y-coordinate as the aforementioned eccentric amount L2 is detected.

After the above-described adjustment of the transfer position is made, a next adjustment wafer W, which is transferred to the periphery coating module 2, is transferred onto the spin chuck 21 at the adjusted transfer position. After the resist film R is formed, this adjustment wafer W is transferred into the imaging module 3, and the image data thereof is obtained. Then, the eccentric amount L2 is acquired from the image data, and it is then determined whether the eccentric amount L2 is smaller than the target eccentric amount. Then, based on this determination result, the adjustment of the transfer position is performed again or the process S2 is ended.

Figure 19:
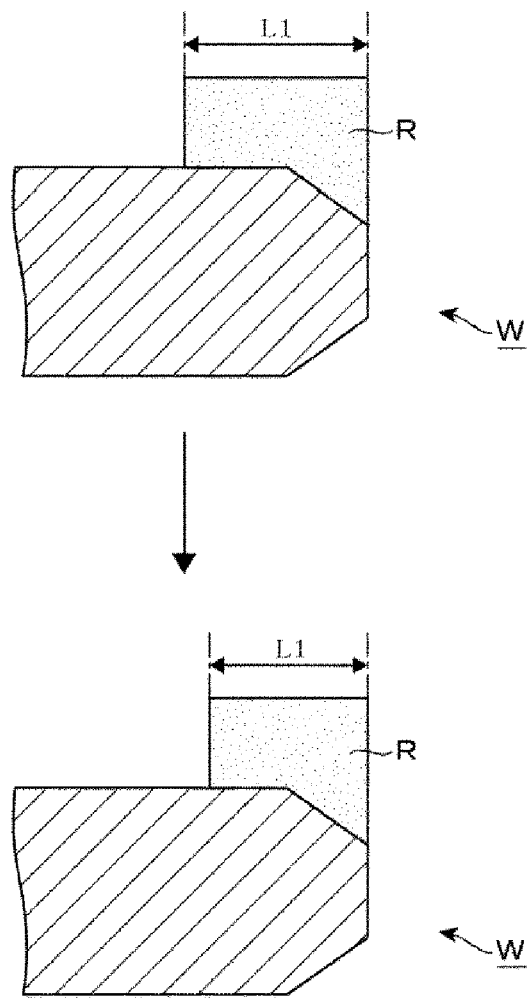
FIG. 19 is a diagram for describing a change of a width of the resist film.

Now, the process S3 will be explained. FIG. 19 shows an outline of the adjustment performed in this process S3, and an upper drawing and a lower drawing of FIG. 19 illustrate longitudinal side views of the adjustment wafers W on which the resist film R is formed before and after the corresponding adjustment is performed, respectively. In the process S3 as well, the formation of the resist film R on the adjustment wafer W in the periphery coating module 2 and the imaging of this adjustment wafer W in the imaging module 3 are performed in the same way as stated above. Then, the same as in the process S2, the width L1 of the resist film R is detected at the multiple positions, for example, 360 positions from the image obtained from the camera 41, and an average of these widths L1 is calculated. Further, it is determined whether the average of these widths L1 falls within a tolerance range which is set to correspond to a set value of the width L1. If the average is found to fall within the tolerance range, the process S3 is ended. If, however, the average is found not to fall within the tolerance range, the discharge moving distance is changed to set the width L1 to the set value. For example, if the set value of the width L1 is 2.0 mm and the average of the detected widths L1 is 2.3 mm, the discharge moving distance of the resist supply nozzle 25 is shortened by 0.3 mm to compensate for the difference of 0.3 mm therebetween. That is, a setting on a recipe for allowing the width L1 of the resist film R to be 2.0 mm is changed to a setting for allowing the width L1 of the resist film R to be 1. 7 mm.

FIG. 19 illustrates a state in which the adjustment is performed to change the width L1 of the resist film R from 2.3 mm to 2.0 mm. Further, since the resist film R at the outer periphery of the wafer W is removed through the above-described cleaning processing, the width L1 of this resist film R is a width after the coating processing and before the cleaning processing. In other words, the adjustment of the width L1 of the resist film R in this process S3 is adjustment of the position of the inner periphery edge of the resist film R.

After the adjustment of the discharge moving distance is made, the processing is performed on a next adjustment wafer W, which is transferred into the periphery coating module 2, by using the adjusted discharge moving distance. Then, the adjustment wafer W after being processed is transferred into the imaging module 3. Thereafter, the average of the widths L1 is obtained from the image data, and it is then determined whether the corresponding average falls within the tolerance range. Based on this determination result, the adjustment of the transfer position is performed again or the process S3 is ended.

Figure 20:
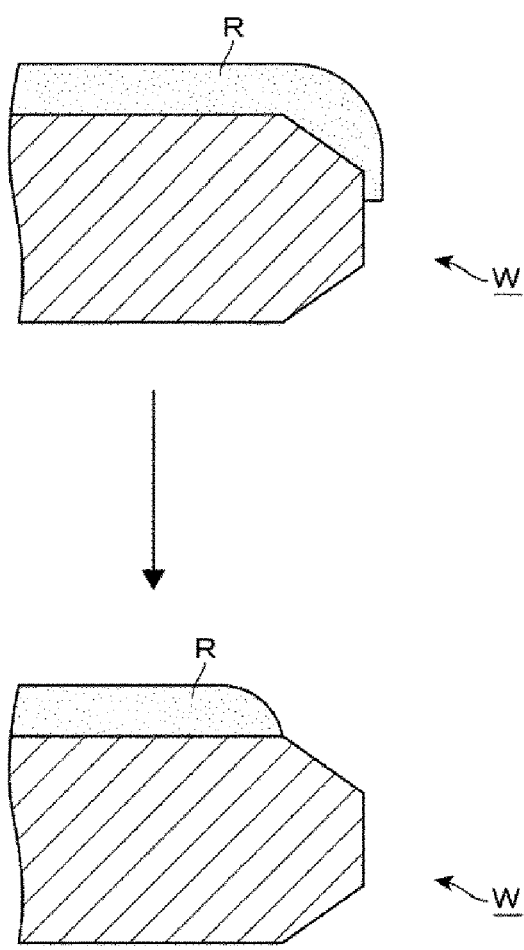
FIG. 20 is a diagram illustrating adjustment of a position of an outer periphery end of the resist film.
Figure 21:
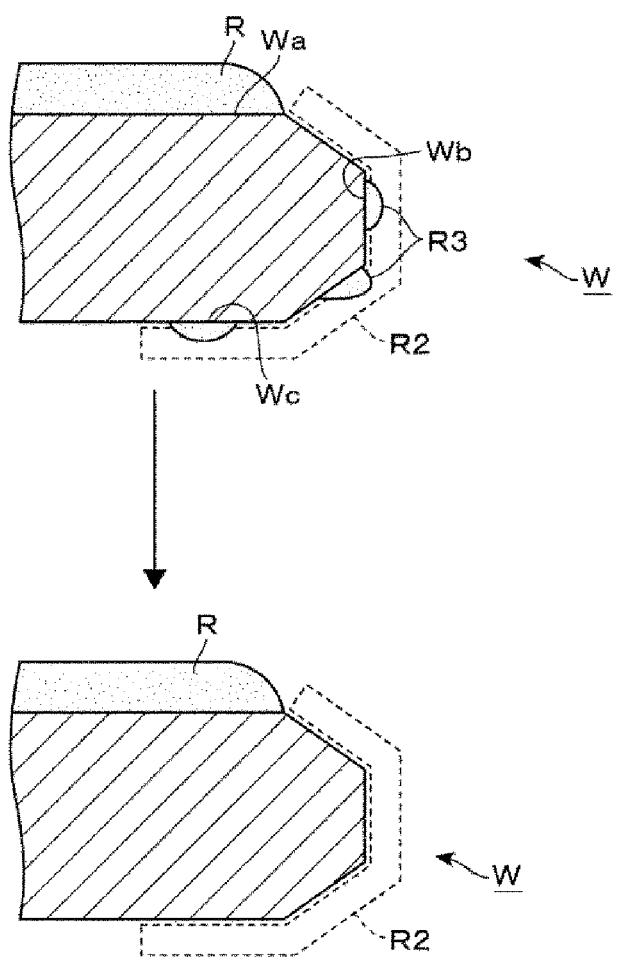
FIG. 21 is a diagram illustrating adjustment of a cleaning time of a wafer.

Now, the process S4 will be discussed. This process S4 is a process of adjusting the cleaning rotation number and the cleaning time as stated above. FIG. 20 shows an outline of adjustment of the cleaning rotation number, and FIG. 21 shows an outline of adjustment of the cleaning time. An upper drawing and a lower drawing of FIG. 20 and FIG. 21 present longitudinal side views of the wafers W subjected to be processed before and after these parameters are adjusted, respectively. The larger the cleaning rotation number is when discharging the removing liquid from the bevel cleaning nozzle 27 shown in FIG. 7, the more difficult it would be for the removing liquid to reach the front surface of the wafer. If the removing liquid is flown to the front surface of the wafer W excessively, the resist film R is removed up to a region inner than desired, whereas if the amount of the removing liquid reaching the front surface is too small, the resist film R may remain at the bevel portion W0. In this process S4, by adjusting the cleaning rotation number, the position of the outer periphery edge of the resist film R is adjusted.

Further, a reference numeral R2 in FIG. 21 denotes an imaging region composed of the front surface peripheral region Wa, the outer end surface Wb and the rear surface Wc of the wafer W imaged by the imaging module 3. With an increase of the cleaning time which is a discharge time of the solvent from the bevel cleaning nozzle 27 and the rear surface cleaning nozzle 28 which are cleaning nozzles, the contamination degree (the number of defects) on the imaging region R2 forming the circumferential periphery of the wafer W is decreased. Further, a reference numeral R3 in the upper drawing of FIG. 21 denotes a residue of the resist film left on the wafer W after the cleaning processing.

Figure 22:
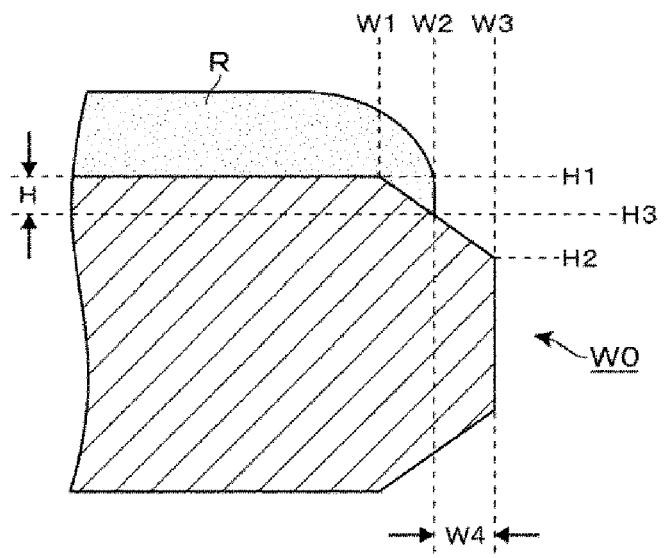
FIG. 22 is a partially longitudinal side view illustrating a bevel portion of the wafer.

The aforementioned adjustment of the cleaning rotation number will be described in further detail with reference to FIG. 22. This adjustment of the cleaning rotation number is carried out by calculating a cut height H shown in FIG. 22. Here, the cut height H refers to a height dimension of the outer edge of the resist film with respect to the inner edge of the bevel portion W0 of the wafer W. Here, a distance between the outer edge of the wafer W (outer edge of the bevel portion W0) and the outer edge of the resist film in the horizontal direction is defined as a cut width W4. With an increase of the cleaning rotation number, the cut width W4 of the resist film at the end portion of the wafer W is decreased whereas the cut height H is increased. It is because the larger the cleaning rotation number is, the more difficult it would be for the removing liquid to reach the front surface of the wafer. In this way, there is a correlation between the cut height H and the cut width W4.

Figure 23:
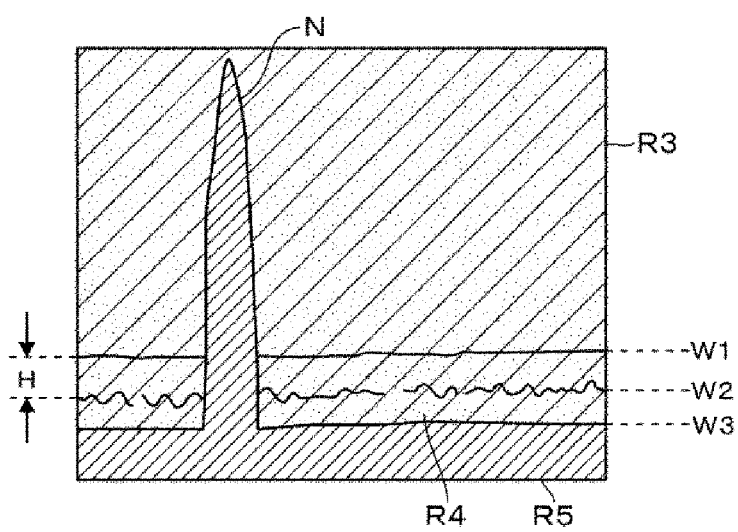
FIG. 23 is a diagram schematically illustrating an imaging result.

An example of a method of calculating the cut height H from the imaging result will be explained with reference to FIG. 22 and FIG. 23. FIG. 22 is a longitudinal side view of the bevel portion W0 of the wafer W, and FIG. 23 is a diagram schematically illustrating an image data of the front surface peripheral region Wa obtained by the imaging module 3. In FIG. 22, a reference numeral H1 represents a height position of the inner edge of the bevel portion W0, and a reference numeral H2 indicates a height position of the outer edge of the bevel portion W0. Further, a reference numeral H3 is a height position of the outer edge of the resist film R (a height position of a boundary between the bevel portion W0 and a region where the resist film R is formed).

In FIG. 23, for example, R3 refers to a region where the coating film is formed; a R4, a region where the coating film is not formed (the front surface of the wafer); and R5, a region where an inspection target does not exist such as the notch of the wafer. These regions R3 to R5 are illustrated to have different contrasts. In FIG. 22 and FIG. 23, W1 indicates a boundary position between the bevel portion and the front surface of the wafer; W2, a cut position; and W3, the outer end position of the wafer. The positions W1 and W2 are detected from the image data due to a difference in the contrasts. As stated above, the cut height H is the height dimension of the outer edge of the resist film R with respect to the inner edge of the bevel portion W0, and can be calculated from W1-W2 since it is in correlation with an absolute value of W1-W2. Further, although this cut height H is an average of the height dimensions of the outer edge of the resist film R with respect to the inner edge of the bevel portion W0 obtained from multiple positions in the circumferential direction of the wafer W, for example, it is simply referred to as the cut height H for the simplicity of explanation.

Figure 24:
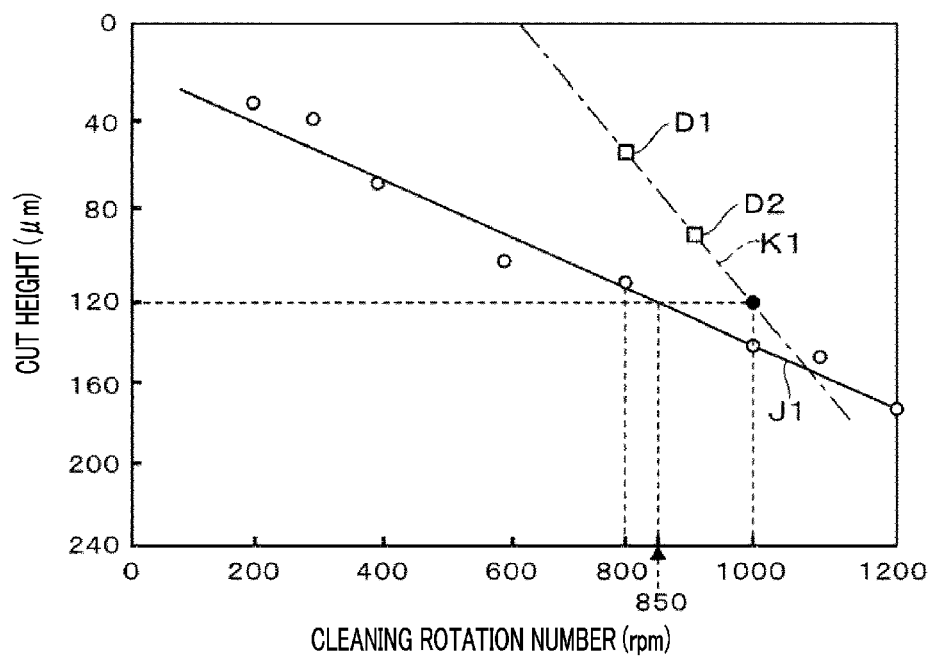
FIG. 24 is a characteristic view presenting reference data and actual data showing a relationship between a cut height and a rotation number.

When adjusting the cleaning rotation number as stated above, a reference data J1, shown in FIG. 24, indicating a correspondence between the cut height and the cleaning rotation number, for example, is used. Further, when adjusting the cleaning time, a reference data J2, shown in FIG. 25, indicating a relationship between the contamination degree generated by the coating liquid on the rear surface of the wafer and a cleaning time for the rear surface of the wafer, for example, is used. These reference data J1 and J2 are obtained as a result of performing a processing by a module which is configured to perform the same processing as in the periphery coating module 2 and in which the respective parameters are completely adjusted.

Figure 26:
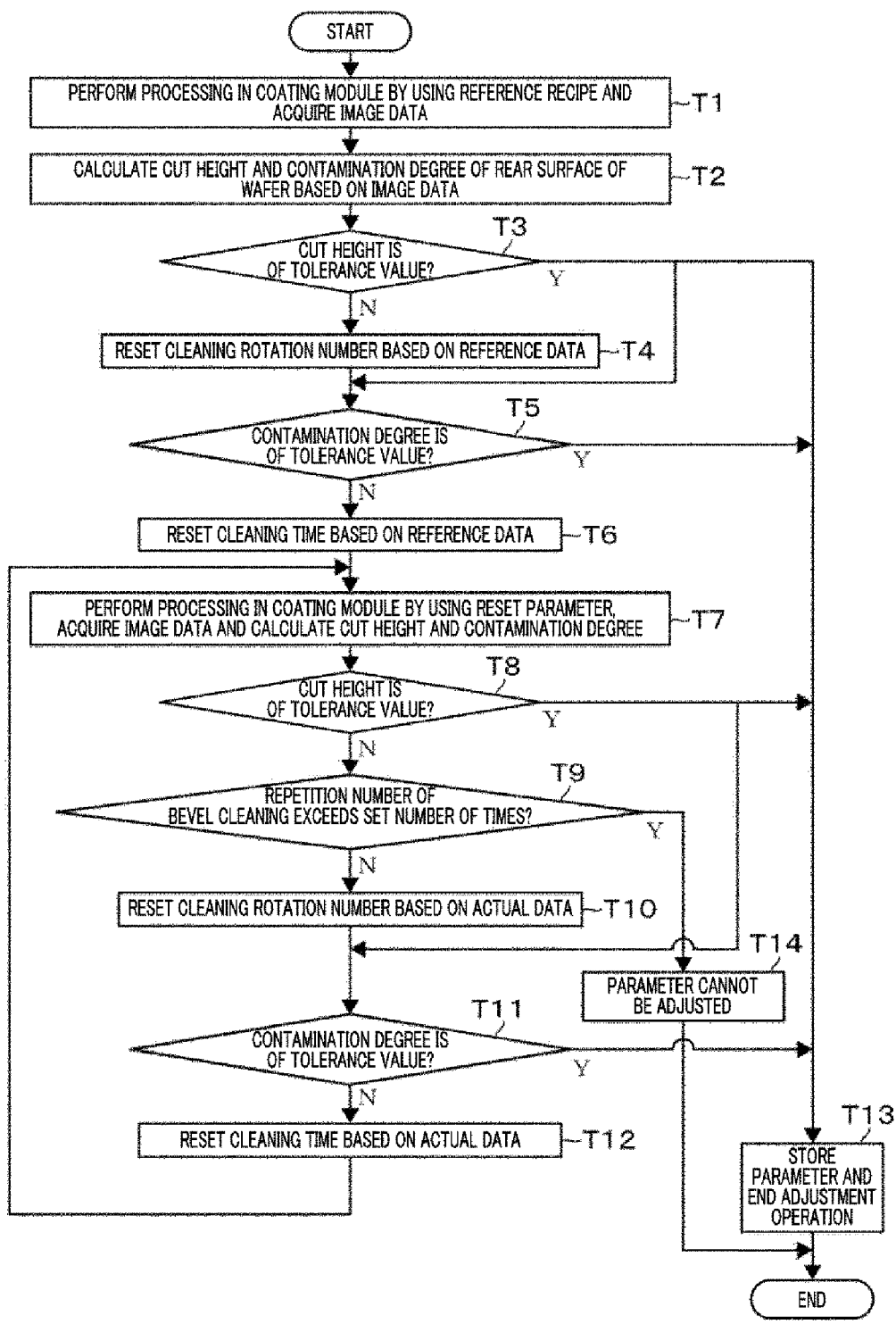
FIG. 26 is a flowchart illustrating adjustments of the cut height and the cleaning time.
Figure 27A:
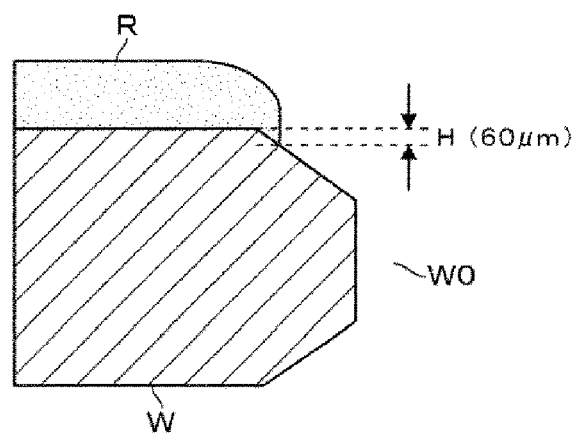
FIG. 27A provides a longitudinal side view of a peripheral portion of the wafer to describe the cut height.
Figure 27B:
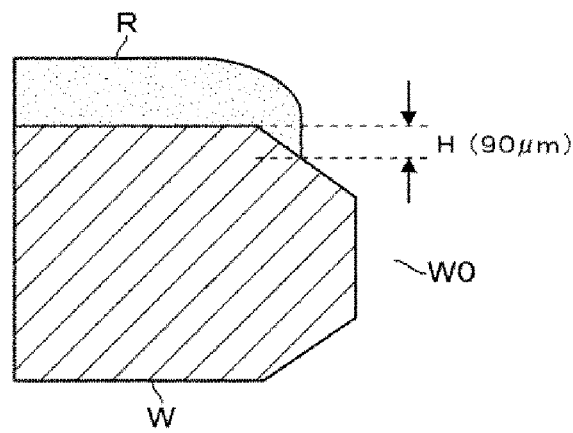
FIG. 27B provides the longitudinal side view of the peripheral portion of the wafer to describe the cut height.
Figure 27C:
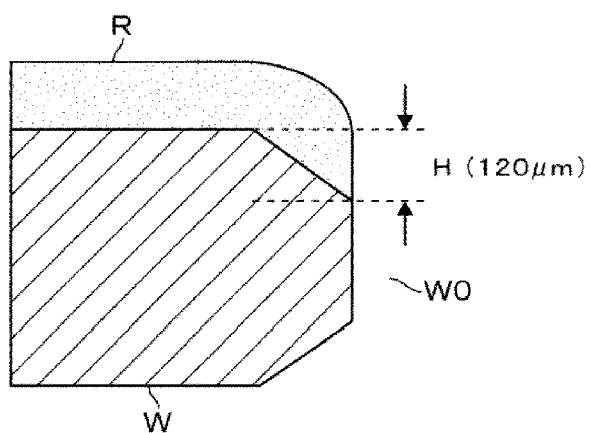
FIG. 27C provides a longitudinal side view of the peripheral portion of the wafer to describe the cut height.

Now, individual processes of the process S4 will be explained with reference to FIG. 26 showing a flowchart of this process S4 and FIG. 27A to FIG. 27C each illustrating a longitudinal side view of the cut resist film R. The adjustment wafer W is transferred into the periphery coating module 2 from the transfer container C, and the resist film R is formed on the adjustment wafer W. Then, this adjustment wafer W is transferred to the imaging module 3 to be imaged, and the image data is obtained (process T1). The cut height H and the contamination degree are calculated based on the obtained image data (process T2), and it is determined whether the cut height H is of a tolerance value (process T3). This tolerance value is a value within a range having a tolerance error of, e.g., 10% with respect to a target value of the cut height H. Here, it is assumed that the target value of the cut height is 120 μm.

If the cut height H is found in the process T3 not to be of the tolerance value, the cleaning rotation number is adjusted based on the reference data J1 (process T4). By way of example, assume that the cleaning rotation number is 800 rpm and the cut height H obtained from the image data is 60 μm smaller than the target value, as shown in FIG. 27A. In this case, the cleaning rotation number is adjusted to be increased to raise the cut height H. In case that the reference data J1 is set as shown in the graph of FIG. 24, the cleaning rotation number is adjusted to 850 rpm corresponding to the cut height of 120 μm.

Meanwhile, if the cut height H is found to be of the tolerance value, a process T5 and a process T13 are performed. In the process T13, the cleaning rotation number set to process the adjustment wafer W upon which the aforementioned determination is made is stored in a storage of the controller 100 to be used as the parameter for processing the product wafer W, and the parameter adjustment for the cleaning rotation number is completed.

In the process T5, it is determined whether the contamination degree is of a tolerance value. If the contamination degree is found to be of the tolerance value, the process T13 is performed. The cleaning time set to process the adjustment wafer W upon which the above-stated determination is made is stored in the storage of the controller 100 to be used as the parameter for processing the product wafer W, and the parameter adjustment for the cleaning time is completed. If, on the other hand, the contamination degree is found to exceed the tolerance value, the cleaning time is adjusted (reset) (process T6), and a process T7 is performed. The adjustment in the process T6 is performed based on the reference data J2 shown in FIG. 25, and the cleaning time is lengthened so that the contamination degree reaches the tolerance value. Here, the description will be provided for a case where the contamination degree exceeds the tolerance value so the cleaning time is adjusted. By way of example, it is assumed that the contamination degree is M1 and the cleaning time is N1 based on the reference data J2.

In the process T7, another adjustment wafer W is transferred into the periphery coating module 2, and the film forming processing is performed on this adjustment wafer W. The cleaning processing in this film forming processing is performed by using the adjusted cleaning rotation number and/or the cleaning time. Then, the image data is obtained by the imaging module 3, and the cut height H and the contamination degree are calculated.

Thereafter, it is determined whether the calculated cut height H is of a tolerance value (process T8). In this example, it is assumed that the calculated cut height H is 90 μm, which is not the tolerance value, as shown in FIG. 27B. In this case, a process T9 is performed. If the operations, after the beginning of the process S4, performed until the determination upon whether a repetition number of the bevel cleaning exceeds a set number of times is made, that is, until the determination upon whether the cut height H calculated from the film forming processing of the resist film R is of the tolerance value is made are set as a series of operations, it is determined in the process T9 whether a repetition number of the series of operations exceeds a set number of times. If the repetition number is found to exceed the set number of times in the process T9, a process T14 is performed, and an alarm is outputted to indicate that the adjustment cannot be accomplished, and the adjustment operation is ended.

If it is determined in the process T9 that the repetition number does not exceed the set number of times, the cleaning rotation number is reset (process T10). This reset is performed based on the actual data K1 shown in FIG. 24. In FIG. 24, a reference numeral D1 is data of the cut height H (60 μm) and the cleaning rotation number (800 rpm) obtained by a first round of the series of operations after the process S3 is ended. A reference numeral D2 is data of the cut height H (90 μm) and the cleaning rotation number (900 rpm) obtained by a second round of the series of operations. The actual data K1 indicating the relationship between the cut height H and the cleaning rotation number is calculated from these data D1 and D2. Then, based on this actual data K1, the cleaning rotation number where a third round of the series of operations is performed for setting the cut height H to 120 μm is calculated, and the cleaning rotation number is reset to this calculated value. Then, a process T11 is performed. In this example, the cleaning rotation number is reset to 1000 rpm.

Meanwhile, if the cut height H obtained by the second round of the series of operations is found in the process T8 to be of the tolerance value, the process T11 and the process T13 are performed. In the process T13, the cleaning rotation number set to process the adjustment wafer W upon which the aforementioned determination is made is stored in the storage of the controller 100 to be used as the parameter for processing the product wafer W, and the parameter adjustment for the cleaning rotation number is completed.

In the process T11, it is determined whether the contamination degree is of the tolerance value. If the contamination degree is found to be of the tolerance value, the process T13 is performed, and the cleaning time at this time is stored as the processing parameter, and the parameter adjustment for the cleaning time is completed. On the other hand, if it is determined in the process T11 that the contamination degree exceeds the tolerance value, the cleaning time is reset (process T12). This reset is performed based on the actual data K2 (see FIG. 25) indicating a relationship between the contamination degree and the cleaning time, which is calculated from the contamination degree and the cleaning time in the first round of the series of operations and the contamination degree and the cleaning time in the second round of the series of operations.

After this reset, another adjustment wafer W is transferred into the periphery coating module 2, and the resist film is formed thereon. Then, the cleaning processing is performed according to the recipe including the cleaning rotation number and the cleaning time which are reset. Thereafter, the cut height and the contamination degree are calculated from the imaging result of the wafer W (process T7). These values calculated based on the imaging result are used as data of the cut height and the contamination degree for a third round of the series of operations.

Then, in the process T8, it is determined whether the calculated cut height is of the tolerance value. In this example, it is assumed that the calculated cut height H is 120 µm as shown in FIG. 27C. Since 120 µm is the tolerance value, the process T11 and the process T13 are performed. In the process T13, the reset cleaning rotation number is stored as the processing parameter, and the parameter adjustment for the cleaning rotation number is ended. If the cut height is not of the tolerance value, the process T9 is performed, and it is determined whether a number of changing times of the cleaning rotation number exceeds a set number of times. If it is determined that the number of changing times of the cleaning rotation number does not exceed the set number of times, the cleaning rotation number is reset (process T10). For this reset, actual data indicating the relationship between the cut height and the cleaning rotation number is calculated from the data (the cut height and the cleaning rotation number) set when the first, second and third rounds of series of operations are performed, and the reset is performed based on this actual data.

Figure 25:
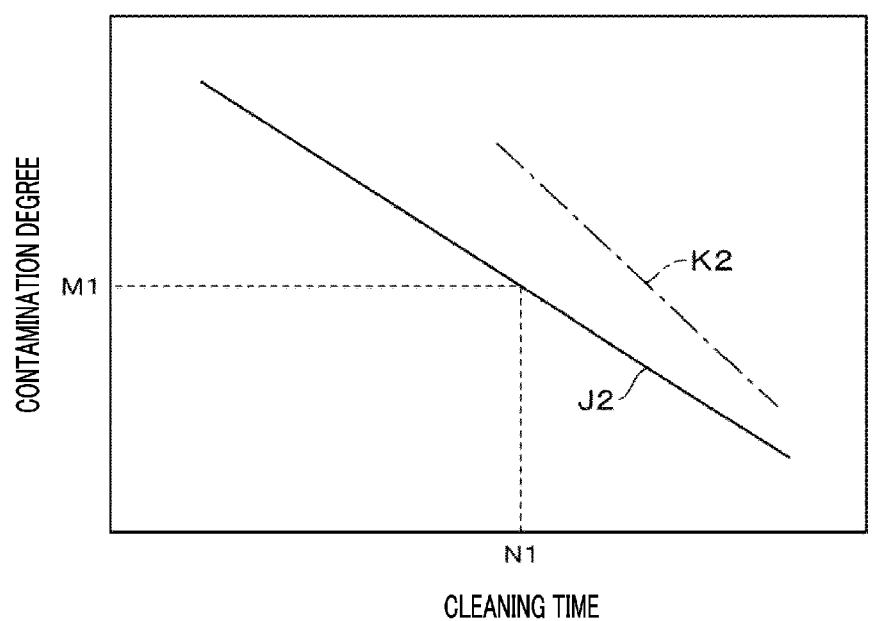
FIG. 25 is a characteristic view presenting reference data and actual data showing a relationship between a contamination degree and a cleaning time.

After the cleaning rotation number is reset, it is determined whether the contamination degree is of the tolerance value (process T11). If so, the process T13 is performed, so the parameter adjustment of the cleaning time as the parameter for the contamination degree is finished. Meanwhile, if the contamination degree exceeds the tolerance value, the cleaning time is reset in the process T12. For this reset, actual data indicating the relationship between the contamination degree and the cleaning time is calculated from data (the contamination degree and the cleaning time) set when the first, second and third rounds of series of operations are performed, and the reset is performed based on this actual data. In the above description, the actual data may be approximation equations or approximation curves as shown in FIG. 24 and FIG. 25.

While the number of changing times of the cleaning rotation number is not found in the process T9 to exceed the set number of times, if the cut height H exceeds the tolerance value, the reset of the cleaning rotation number, the performing of the series of operations again to calculate the cut height, and the determining whether the calculated cut height is of the tolerance value are repeated. Further, if the contamination degree exceeds the tolerance value, the cleaning time is reset, and after performing the formation of the coating film and the cleaning processing again, the operations of calculating the contamination degree and determining whether the calculated contamination degree is of the tolerance value are repeated. Then, if the cleaning rotation number and the cleaning time are set in the process T13, the adjustment operation is ended. That is, the flow of FIG. 12 is ended.

That is, before the beginning of the flow shown in FIG. 12, the user sets the resist in the periphery coating module 2, sets the transfer container C in the carrier block B1 and then inputs the width of the resist film R, the target discharge amount and the viscosity of the resist for performing the process S1. Thereafter, the user makes a preset instruction to start the adjustment operation. Accordingly, the flow of FIG. 12 is performed, and the adjustment operation is automatically performed. Upon the completion of the flow, the product wafer W is transferred from the transfer container C into the periphery coating module 2 and processed therein, the same as the adjustment wafer W. The transfer and the processing of the product wafer W are performed by using the parameters determined in the flow. Then, the product wafer W is returned back into the transfer container C.

Further, as stated above, there may be a case in which a multiple number of combinations of the discharge rotation number and the resist discharge amount are provided in the process S1. In these multiple combinations, the ones determined not to be used in the adjustments in the subsequent processes S2 to S4 need to be excluded. If there remain multiple combinations upon the completion of the process S4, any one of these multiple combinations may be selected.

Now, a configuration of the controller 100 configured to perform the above-described adjustment operations will be explained with reference to FIG. 28. A reference numeral 101 is a bus. The controller 100 includes a program storage 102, a data storage 103, a parameter storage 104, a setting unit 105, a display 106 and a non-illustrated CPU which are all connected to the bus 101. The program storage 102 stores a program 107 therein. This program 107 implements the flow of FIG. 12, thus carrying out the automatic adjustment. That is, the various determinations based on the images and the adjustments (reset) of the parameters are performed. Further, control signals are outputted to the individual components of the coating and developing apparatus 1 by the program 107, so that operations of the individual components are controlled. Accordingly, the processings upon the product wafer W and the adjustment wafer W are performed. The program 107 is stored in the program storage 102 by being stored in a recording medium such as, but not limited to, a hard disk, a compact disk, a magnet optical disk, a memory card or a DVD.

The data storage 103 stores therein the reference data J1 and J2 to be used in the aforementioned process S4. The parameter storage 104 stores therein the candidate range for the discharge rotation number, the candidate range for the resist discharge amount, the transfer position, the discharge moving distance, the cleaning rotation number and the cleaning time as stated above. The discharge rotation number and the resist discharge amount, which are determined from the candidate range for the discharge rotation number and the candidate range for the resist discharge amount as stated above, are also stored in this parameter storage 104. Based on the parameters stored in this parameter storage 104, the program 107 outputs the controls signals, so that the individual components of the apparatus are controlled. Further, the adjustments of the parameters in the description of the flow of FIG. 12 are carried out by resetting the parameters stored in this parameter storage 104.

The setting unit 105 is composed of, by way of non-limiting example, a key board or a touch panel to allow the user to input the target discharge amount and the viscosity of the resist so that the narrowing of the parameter range in the process S1 described in FIG. 13 is performed. Further, the instruction from the user to start the automatic adjustment and the setting of the width L1 of the resist film R by the user are also performed through this setting unit 105, for example. The display 106 may be composed of, by way of example, a monitor, and an alarm indicating that the flow of the above-stated adjustment operations cannot be performed, for example, is displayed on this display 106. Further, the alarm may be outputted in the form of a voice from a speaker or the like.

Meanwhile, if the above-described adjustments are performed without using the imaging module 3 and the controller 100, the wafer W on which the resist film R is formed may be carried to the outside of the coating and developing apparatus 1, and the film formation state of the resist film may be checked by using an inspection apparatus provided at the outside thereof. Then, the adjustments of the parameters may be performed based on the inspection result. Since, however, a transfer time and a standby time are required until the wafer W is transferred into the inspection apparatus, it takes time to complete the parameter adjustments. Further, the transferring of the wafer W between the external inspection apparatus and the coating and developing apparatus 1 may impose a burden on the operator.

Further, instead of using the inspection apparatus provided at the outside of the coating and developing apparatus 1, the operator may check the film formation state of the resist film R by using, for example, a microscope at the outside of the coating and developing apparatus 1. In such a case, however, the operator still has a trouble to observe the resist film R. Further, if multiple operators observe the resist film R, the accuracy of the adjustment may be non-uniform between the operators since the operators may have different criteria of the determination. That is, the accuracy of the adjustment may become non-uniform between multiple periphery coating modules 2 within the same coating and developing apparatus 1 or between multiple periphery coating modules 2 of different coating and developing apparatuses 1. Furthermore, even in case that the inspection is performed after transferring the wafer W into the inspection apparatus provided at the outside of the coating and developing apparatus 1, the criteria of the determination may be differed depending on characteristics of the inspection apparatuses. As a result, the accuracy of the adjustment may not be uniform.

According to the above-described coating and developing apparatus 1, however, the various kinds of parameters for performing the processings on the product wafer W are automatically determined based on the images obtained by the imaging module 3. Accordingly, for the adjustment performed before the processings on the product wafer W is performed, the need for the operator to attend or the number of processings that need to be performed by the operator is reduced, so that the burden on the operator can be reduced. Further, according to the coating and developing apparatus 1 of the present disclosure, the wafer W on which the film is formed need not be transferred to the apparatus provided at the outside of the coating and developing apparatus 1 in performing the parameter adjustments. Thus, the time that is required for this transfer can be saved, and the efficiency of the parameter adjustments can be improved.

Here, assume that multiple periphery coating modules 2 are provided within the coating and developing apparatus 1. In case of performing the adjustment of each periphery coating module 2, the controller 100 performs the parameter adjustments based on the acquired images. Thus, as compared to the case where the operator performs those adjustments, there is no problem that the criteria of the determination is not uniform between different operators. If it is assumed that the common imaging module 3 is shared by the multiple periphery coating modules 2, the non-uniformity in the adjustment due to the difference in the characteristics of the inspection apparatuses may also be suppressed. That is, according to the coating and developing apparatus 1 having the above-described configuration, the non-uniformity in the accuracy of the adjustment between the respective periphery coating modules 2 of the coating and developing apparatus 1 can be suppressed. In addition, even in case of performing the adjustment of the periphery coating modules 2 of different coating and developing apparatuses 1, since the controller 100 sets the parameters using the same criteria based on the image data, non-uniformity in the accuracy of the adjustment can be suppressed as compared to the case where the operator performs the adjustment.

In the above-stated process S1, the range of the combination of the parameters to be used is narrowed depending on the viscosity of the resist as stated above. That is, it is possible to suppress the processing from being performed by using the combination of the parameters in which the normal film formation is difficult. Thus, the automatic adjustment can be performed at a high speed. Further, after the determination upon the normality or abnormality is performed, the combination of the parameters having the resist discharge amount closest to the resist discharge amount of the combination of the parameters considered to be abnormal is excluded, and the appropriate combination of the parameters is determined. Therefore, the accuracy of the determined combination of the parameters may be heightened.

Further, in the process S4, when performing the series of operations after the third round thereof, the actual data, instead of the reference data, are used for the reset of the cleaning rotation number and the cleaning time. Accordingly, the accuracy of the reset parameters is further improved, and a time required for the adjustments of the parameters is further shortened. In performing this process S4, the imaging module 3 images the entire imaging region R2 ranging from the rear surface to the front surface of the periphery of the wafer W, and the contamination degree of the imaging region R2 is thus detected. That is, by configuring the imaging module 3 to capture the image of the entire imaging region R2 at one time, this process S4 can be performed at a high speed.

Furthermore, the aforementioned Patent Documents 1 and 2 describe the apparatuses configured to perform the ring-shaped resist film R along the periphery of the wafer W. However, neither of these patent documents mention anything about the technique of setting the parameters required for the processing based on the image as in the coating and developing apparatus 1.

The series of operations of the processes S1 to S4 are all performed automatically. However, only a part of these processes S1 to S4 may be performed automatically, and the adjustment in the process which is not performed automatically may be performed manually by the user. By way of example, after the completion of the process S1, the user may operate the apparatus through the setting unit 105 to thereby perform the adjustment. As another example, the processes S1 to S3 may be performed as the user operates the apparatus manually, and the process S4 may be automatically performed after the completion of these manual adjustments.

Moreover, in the process S1, one of the discharge rotation number and the resist discharge amount may be set to be a fixed value, and only the other may be decided from the candidate values. Further, in the above description of the process S1, though the candidate values of the discharge rotation number and the candidate values of the resist discharge amount are set at the intervals of 100 rpm and 0.2 g, respectively, the exemplary embodiment may not be limited to these examples, and the intervals may be set to be larger or smaller than these pitches. Further, as described in FIG. 14 and FIG. 15, though only the combination of the resist discharge amount having the value closest to the resist discharge amount considered to be abnormal and the discharge rotation number is excluded from the appropriate combination, the exemplary embodiment is not limited thereto. By way of example, besides the combination having such a resist discharge amount closest to the resist discharge amount found to be abnormal, a combination having a resist discharge amount secondly closest to this abnormal resist discharge amount may also be excluded from the appropriate combination to determine the parameters. Furthermore, in the combinations found to be normal, a combination having a discharge rotation number closest to the discharge rotation number of the combination found to be abnormal may also be excluded from the appropriate combination to determine the parameters. As stated, in the determining, in the process S1, the appropriate combination from the combinations of the parameters found to be normal, the exemplary embodiment is not limited to the above-stated examples.

Figure 29:
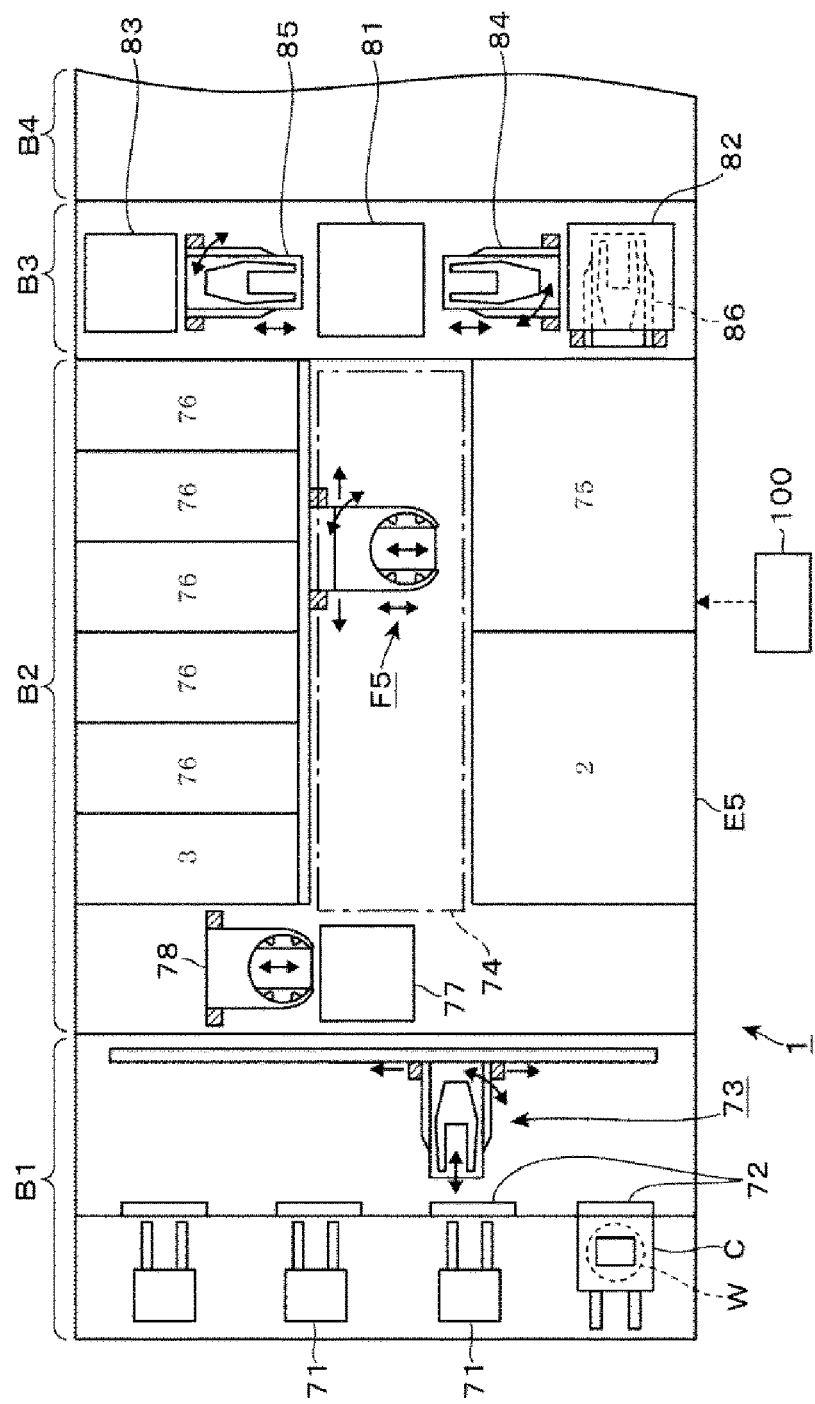
FIG. 29 is a plan view of the coating and developing apparatus.
Figure 30:
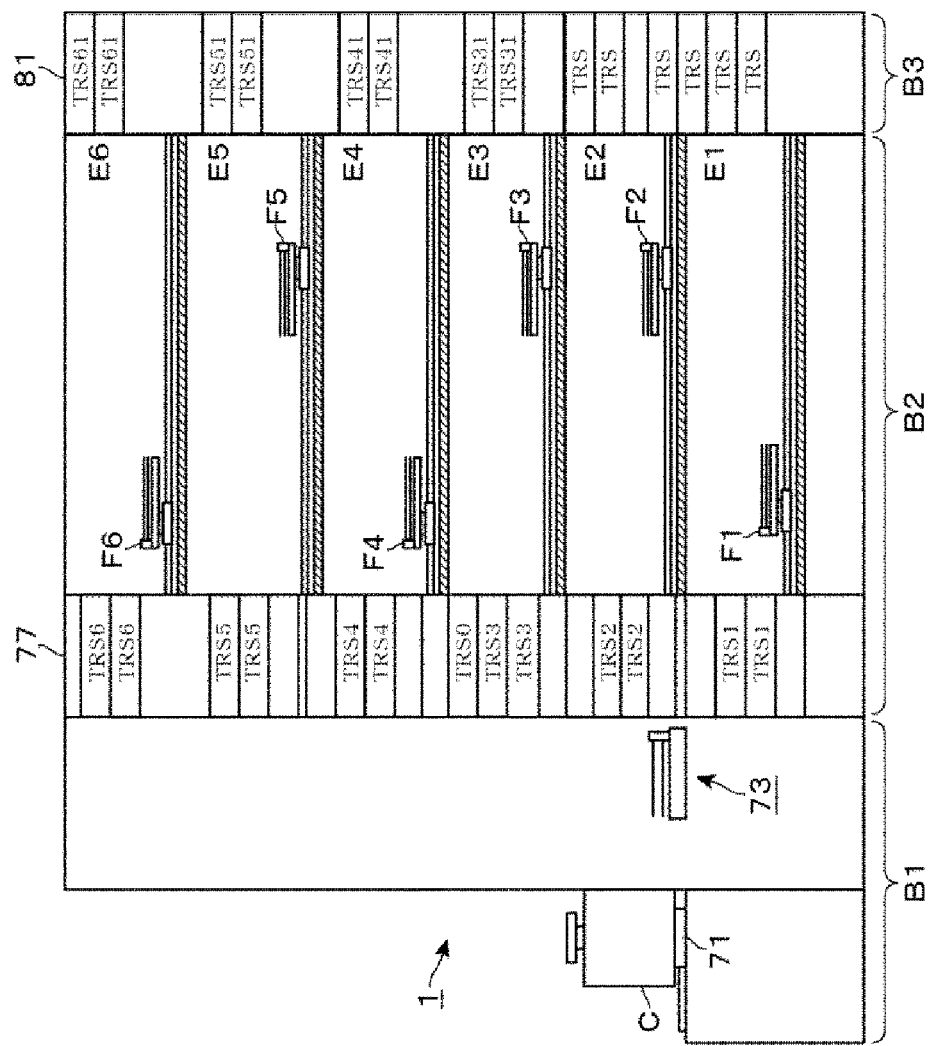
FIG. 30 is a longitudinal side view of the coating and developing apparatus.

Now, an example of a more specific configuration of the coating and developing apparatus 1 shown in FIG. 1 will be explained with reference to a plan view of FIG. 29 and a longitudinal side view of FIG. 30. The coating and developing apparatus 1 includes a carrier block B1 configured as a carry-in/carry-out block, a processing block B2 and an interface block B3 which are connected in a straight line shape in a horizontal direction. A reference numeral B4 in the drawing is an exposure apparatus. A wafer W within a transfer container C placed on a placing table 71 of the carrier block B1 is transferred into the processing block B2 through an opening/closing unit 72 by a transfer mechanism 73.

The processing block B2 includes unit blocks E1 to E6, which are stacked on top of each other in sequence from the bottom and each configured to perform a liquid processing on the wafer W. In these unit blocks E1 to E6, transfer of wafers W and processings upon the wafers W are performed in parallel. The unit blocks E1 and E2 have the same configuration, the unit blocks E3 and E4 have the same configuration, and the unit blocks E5 and E6 have the same configuration.

The periphery coating module 2 and the imaging module 3 described above are provided in each of the unit blocks E5 and E6. FIG. 29 is a plan view of the unit block E5. The periphery coating module 2 and a developing module 75 are arranged at one side of a transfer path 74 side by side. The developing module 75 is configured to supply a developing liquid as a chemical liquid to the wafer W to perform a developing processing. The imaging module 3 and a heating module 76 are provided at the other side of the transfer path 74.

The unit blocks E1 to E4 have the same configuration as that of the unit blocks E5 and E6 except that a chemical liquid supplied to the wafer W is different. Each of the unit blocks E1 and E2 is equipped with, instead of the periphery coating module 2 and the developing module 75, an antireflection film forming module configured to supply a chemical liquid for forming an antireflection film onto the wafer W. Each of the unit blocks E3 and E4 is equipped with, instead of the periphery coating module 2 and the developing module 75, a resist coating module configured to form a resist film by supplying a resist to the wafer W. Unlike the periphery coating module 2, this resist coating module supplies the resist to the entire surface of the wafer W. In FIG. 30, transfer mechanisms of the unit blocks E1 to E6 are assigned reference numerals F1 to F6, respectively.

A tower 77 vertically extended along the unit blocks E1 to E6 and a vertically movable transfer mechanism 78 configured to transfer the wafer W with respect to the tower 77 are provided near the carrier block B1 within the processing block B2. The tower 77 is composed of a multiple number of modules stacked on top of each other and is equipped with transit modules TRS on which the wafer W is placed.

The interface block B3 includes towers 81, 82 and 83 vertically extended along the unit blocks E1 to E6 and is equipped with a vertically movable transfer mechanism 84 configured to transfer the wafer W with respect to the towers 81 and 82, a vertically movable transfer mechanism 85 configured to transfer the wafer W with respect to the towers 81 and 83, and a transfer mechanism 86 configured to transfer the wafer W with respect to the tower 82 and the exposure apparatus B4. The tower 81 is equipped with transit modules TRS. Description of modules provided in the towers 82 and 83 will be omitted here. Further, the transfer mechanism 11 of the FIG. 1 corresponds to the transfer mechanisms F1 to F6, 73, 78, and 84 to 86. The transfer mechanism 11 of FIG. 3 is a specific example of the transfer mechanism F5.

In this coating and developing apparatus 1, a transfer path of the adjustment wafer W and the product wafer W will be explained. The wafer W is transferred from the transfer container C into a transit module TRS0 of the tower 77 within the processing block B2 by the transfer mechanism 73. From the transit module TRS0, the wafer W is sent into either the unit block E1 or the unit block E2.

Then, the wafer W is transferred into a transit module TRS1 (TRS2)→ the antireflection film forming module→ the heating module→ the transit module TRS1 (TRS2) in this order. Then, the wafer W is sent into either a transit module TRS3 corresponding to the unit block E3 or a transit module TRS4 corresponding to the unit block E4 by the transfer mechanism 78.

Then, the wafer W sent into the transit module TRS3 (TRS4) is processed by being transferred from the corresponding transit module TRS3 (TRS4) into the coating module and the heating module in sequence within the unit block E3 (E4). Then, the wafer W is transferred into a transit module TRS31 (TRS41) of the tower 81 and then carried into the exposure apparatus B4 via the tower 81 by the transfer mechanisms 84 and 86, and the resist film is exposed to light.

The wafer W after being exposed is transferred between the towers 81 and 82 by the transfer mechanisms 84 and 86, and transferred into a transmit module TRS51 (TRS61) of the tower 81 corresponding to the unit block E5 (E6). Thereafter, the wafer W is transferred into the heating module 76, and an after-exposure heating processing (post exposure bake) is performed. Afterwards, the wafer W is transferred into the developing module 75. A developing liquid is supplied onto the wafer W, and the resist pattern is formed. Thereafter, the wafer W is sent into the periphery coating module 2, and a resist film R is formed on the wafer W. Then, the wafer W having the resist film R formed thereon is transferred into the heating module 76 to be heated. Next, the wafer W is transferred into the imaging unit 3 to be imaged. Afterwards, the wafer W is sent into a transmit module TRS5 (TRS6) of the tower 77 and returned back into the transfer container C by the transfer mechanism 73.

The film formed on the periphery of the wafer W may not be limited to the protection film which suppresses an unnecessary film from being formed but may be a film for suppressing a foreign substance from scattering from the periphery of the wafer W. Further, in the above-described exemplary embodiments, though the resist is supplied to the wafer W as the coating liquid, the coating liquid is not limited to the resist, and a coating liquid for forming the antireflection film or a coating liquid for forming an insulating film may be used. Furthermore, the above-described exemplary embodiments are nothing more than examples and are not intended to be anyway limiting. The exemplary embodiments can be omitted, replaced or modified in various ways without departing from the scope of the following claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An adjustment method of a coating film forming apparatus, the adjustment method comprising:
   carrying in a circular substrate having a front surface, a rear surface and an outer end surface between the front surface and the rear surface from a carry-in/out section;
   forming, in a periphery coating module, a ring-shaped coating film by supplying a coating liquid along a periphery of the substrate based on a processing parameter for controlling a coating state of the periphery of the substrate by the coating film;
   imaging, by an imaging module, a front surface peripheral region and the outer end surface of the substrate on which the ring-shaped coating film is formed, the outer end surface of the substrate including a bevel portion of the substrate;
   transferring the substrate between the periphery coating module and the imaging module by a transfer mechanism;
   forming the ring-shaped coating film on adjustment substrates based on the processing parameter having different values to adjust an operation of the apparatus and imaging the adjustment substrates by the imaging module;
   determining a normality or an abnormality of the coating state of the periphery of the substrate based on a result of the imaging of the substrate and adjusting the operation of the apparatus based on a result of the determining wherein the determining of a normality or an abnormality includes determining whether a contamination degree is within a tolerance range based on an image of the outer end surface;
   determining a value of the processing parameter for forming the ring-shaped coating film on the substrate in the periphery coating module;
   removing an outer periphery of the ring-shaped coating film by rotating the substrate and discharging onto the bevel portion of the rotating substrate a removing liquid to remove the outer periphery of the ring-shaped coating film from the substrate while the substrate is rotating;
   determining whether a cut height is of a tolerance value, wherein the cut height is a height dimension of an outer edge of the ring-shaped coating film with respect to an inner edge of the bevel portion of the substrate in the image of the outer end surface, and
   adjusting a rotation rate during the removing of the outer periphery of the ring-shaped coating film based on a result of the determining whether the cut height is of the tolerance value.

2. The adjustment method of claim 1,
   wherein the outer end surface includes a vertical portion that is perpendicular to the front surface and the rear surface, and
   the imaging of the front surface peripheral region and the outer end surface of the substrate on which the ring-shaped coating film is formed includes imaging the vertical portion.

3. The adjustment method of claim 1,
   wherein the coating state of the periphery of the substrate is determined to be abnormal when a place where the coating film is not formed in the periphery of the substrate is observed from the result of the imaging of the substrate.

4. The adjustment method of claim 1, further comprising:
   discharging the removing liquid toward the outer end surface of the substrate from a bevel cleaning nozzle, and
   discharging a cleaning liquid toward the rear surface of the substrate from a rear surface cleaning nozzle which is different from the bevel cleaning nozzle.

5. The adjustment method of claim 4,
   wherein the bevel cleaning nozzle and the rear surface cleaning nozzle are directed diagonally upwards from below the substrate and outwards from a center of the substrate.

6. The adjustment method of claim 1, further comprising:
   adjusting a cleaning time during the removing of the outer periphery of the ring-shaped coating film based on the contamination degree.

7. The adjustment method of claim 1,
   wherein the adjusting of the rotation rate comprises, when the cut height is smaller than a target value and out of the tolerance value, increasing the rotation rate to raise the cut height.

8. The adjustment method of claim 1,
   wherein the determining of whether the cut height is of the tolerance value comprises obtaining the outer edge of the ring-shaped coating film between the inner edge of the bevel portion and an outer edge of the bevel portion in the image of the outer end surface.

9. The adjustment method of claim 1,
   wherein the determining of whether the cut height is of the tolerance value comprises obtaining the outer edge of the ring-shaped coating film between the inner edge of the bevel portion and an outer edge of the bevel portion in the image of the outer end surface, and
   the adjusting of the rotation rate comprises, when the cut height is smaller than a target value and out of the tolerance value, increasing the rotation rate to raise the cut height.

* * * * *